(12) United States Patent
Sugiyama et al.

(10) Patent No.: US 6,803,623 B2
(45) Date of Patent: Oct. 12, 2004

(54) NONVOLATILE SEMICONDUCTOR MEMORY DEVICE WHICH CAN OPERATE AT HIGH SPEED WITH LOW VOLTAGE, AND MANUFACTURING METHOD THERE

(75) Inventors: Nobuyo Sugiyama, Hyogo (JP); Shinji Odanaka, Osaka (JP); Hiromasa Fujimoto, Kyoto (JP); Seiki Ogura, Wappingers Falls, NY (US)

(73) Assignees: Matsushita Electric Industrial Co., Ltd., Osaka (JP); Halo LSI Design and Device Technologies Inc., Wappingers Falls, NY (US)

( * ) Notice: Subject to any disclaimer, the term of this patent is extended or adjusted under 35 U.S.C. 154(b) by 0 days.

(21) Appl. No.: 10/003,434

(22) Filed: Dec. 6, 2001

(65) Prior Publication Data

US 2002/0074583 A1 Jun. 20, 2002

(30) Foreign Application Priority Data

Dec. 15, 2000 (JP) .................................... 2000-382233

(51) Int. Cl.$^7$ ............................................. H01L 29/788
(52) U.S. Cl. ..................................... 257/315; 257/314
(58) Field of Search .................................. 257/314, 315, 257/316, 322, 317, 318, 344, 404, 428, 320, 321, 323, 324, 325, 326, 319

(56) References Cited

U.S. PATENT DOCUMENTS

| 4,665,418 A | * | 5/1987 | Mizutani |
| 5,264,384 A | * | 11/1993 | Kaya et al. |
| 5,591,652 A | | 1/1997 | Matsushita |
| 5,650,340 A | * | 7/1997 | Burr et al. |
| 5,780,912 A | * | 7/1998 | Burr et al. |
| 5,998,265 A | * | 12/1999 | Fukimoto |
| 6,121,655 A | | 9/2000 | Odanaka et al. |

FOREIGN PATENT DOCUMENTS

| EP | 0 530 644 A2 | 3/1993 |
| EP | 0 905 790 A2 | 3/1999 |
| EP | 0 935 293 A2 | 8/1999 |
| JP | 11-345888 | 12/1999 |
| JP | 11-345888 A | * 12/1999 |

OTHER PUBLICATIONS

Sedra and Smith, "Microelectronic Circuits," 1991, Saunders College Publishing, 3$^{rd}$ ed., pp. 968–970.*
Sedra and Smith, "Microelectronic Circuits," 1991, Saunders College Publishing, 3rd ed., pp. 301–302.*

* cited by examiner

Primary Examiner—Nathan J. Flynn
Assistant Examiner—Kevin Quinto
(74) Attorney, Agent, or Firm—McDermott, Will & Emery

(57) ABSTRACT

The nonvolatile semiconductor memory device has a floating gate electrode that is formed on the semiconductor region and stores carriers injected from the semiconductor region and a control gate electrode that controls the quantity of stored carriers by applying a predetermined voltage to the floating gate electrode. The source region is formed in the semiconductor region on one of side regions of the floating gate electrode and control gate electrode, while the drain region is formed on the other of the side regions thereof. The drain region creates an electric field from which the carriers injected into the floating gate electrode are subject to an external force having an element directed from the semiconductor region to the floating gate electrode.

18 Claims, 33 Drawing Sheets

NONVOLATILE SEMICONDUCTOR MEMORY DEVICE WHICH CAN OPERATE AT HIGH SPEED WITH LOW VOLTAGE, AND MANUFACTURING METHOD THERE

BACKGROUND OF THE INVENTION

This invention relates to a nonvolatile semiconductor memory device that can be operated at high speed with low voltage and to its manufacturing method.

Now the prior art nonvolatile semiconductor memory device is explained with reference to the attached drawings.

FIG. 33 illustrates a schematic cross sectional view of the prior art nonvolatile semiconductor memory device. Referring now to FIG. 33, a floating gate electrode 203 is formed on the semiconductor substrate 201 via a first dielectric film 202; on this floating gate 203, a control gate electrode 205 is formed via a second dielectric film 204; a source region 206 and a drain region 207 are formed in the semiconductor substrate 201 on both side regions of the floating gate electrode 203.

In the nonvolatile semiconductor memory device of such a structure, hot electrons are generated near the drain region 207 where a positive voltage is applied, and the generated hot electrons are injected into the floating gate electrode 203 when data is written. In order to improve the writing performance, a voltage higher than that applied to the source region 206 is applied to the drain region 207. Then since the electric field in parallel to the substrate is raised, the efficiency of generating hot electrons is raised as well. The floating gate electrode 203 is mounted in parallel to the direction in which hot electrons run. Thus, in order to inject hot electrons into the floating gate electrode 203, which are generated in the channel region under the floating gate electrode 203, the hot electrons must be scattered to change their direction of movement.

Further, for higher probability of carrier injection, high voltage must be applied to the control gate electrode 205 for raising the potential bias between the floating gate and the drain, in order to electrically pull hot electrons toward the floating gate electrode 203.

However, in the prior art nonvolatile semiconductor memory device, if the drain voltage is raised to increase the hot electron generation efficiency, the potential between the floating gate and the drain falls and then the hot electron injection efficiency falls as well.

Meanwhile, if the voltage applied to the control gate electrode 205 is raised, the electric field along the substrate is attenuated and then the hot electron generation efficiency falls.

Namely, there is a problem that the writing speed cannot be raised only by applying high voltage to either the control gate electrode 205 or the drain region 207.

SUMMARY OF THE INVENTION

It is, therefore, an object of the present invention to provide a nonvolatile semiconductor memory device that can attain high carrier injection efficiency even at low voltage when hot carriers are injected into the floating gate electrode.

To attain the above object, the present invention proposes a drain region structure in which the injected carriers are subject to an external electric force toward the floating gate electrode when the carriers are injected into the floating gate electrode.

A first nonvolatile semiconductor memory device according to the present invention comprises: a floating gate electrode, formed on a semiconductor region, for storing carriers injected from the semiconductor region; a control gate electrode for controlling a quantity of stored carriers by applying a predetermined voltage to the floating gate electrode; and a source region formed in the semiconductor region on one of side regions of the floating gate electrode and control gate electrode and a drain region formed in the semiconductor region on the other of side regions thereof; wherein the drain region creates an electric field so that the carriers injected to the floating gate electrode are subject to an external force having an element directed from the semiconductor region to the floating gate electrode.

According to the first nonvolatile semiconductor memory device, the drain region creates an electric field so that the carriers injected to the floating gate electrode are subject to an external force directed from the semiconductor region toward the floating gate electrode. Then if the voltage applied to the drain region is relatively low during the writing operation, the hot carrier injection efficiency is improved since the hot carriers generated under the floating gate electrode are pulled by the floating gate electrode.

To be more specific, a second nonvolatile semiconductor memory device according to the present invention comprises: a floating gate electrode formed ion a semiconductor region via a first dielectric film; a control gate electrode capacitively coupled with the floating gate electrode via a second dielectric film; and a source region formed in the semiconductor region on one of side regions of the floating gate electrode and control gate electrode and a drain region formed in the semiconductor region on the other of side regions thereof; wherein the end of the drain region faced with the source region has an embedded drain region extending toward the source region without reaching the surface of the semiconductor region, and a channel region is formed near the surface of the semiconductor region above the embedded drain region in.

According to the second nonvolatile semiconductor memory device, the end of the drain region on the side of the source region has an embedded drain region extending toward the source region without reaching the surface of the semiconductor region. As a result, the channel region is formed near the surface of the semiconductor region above this embedded drain region. Then during the writing operation the carriers injected to the floating gate electrode are subject to an external force having a force element directed from the semiconductor region toward the floating gate electrode, and if the voltage applied to the drain region is relatively low the hot carriers generated near under the floating gate electrode are pulled to the floating gate electrode. As a result, the hot carrier injection efficiency is improved.

Preferably, the second nonvolatile semiconductor memory device further comprises an embedded region adjacent upper area that is formed in an upper part of the embedded drain region in the semiconductor region and has a conduction type opposite to that of the drain region. Then, if both embedded drain region and the drain region are n-type, for example, the boundary between the embedded drain region and the embedded region adjacent upper area becomes a pn junction. The electric field between the embedded drain region and the embedded region adjacent upper area is augmented when a bias voltage is applied to the substrate. As a result, the carrier injection efficiency is further raised.

In this case, it is preferable that the impurity concentration in the embedded region adjacent upper area is higher than that in the semiconductor region.

Otherwise in this case, the embedded drain region has the conduction type opposite to that of the drain region and an impurity concentration lower than that in the embedded region adjacent upper area. It becomes thereby possible to raise the carrier injection efficiency even if the embedded drain region has the conduction type opposite to that of the drain region.

In the second nonvolatile semiconductor memory device according to the invention, it is preferable that the embedded drain region has the same conduction type as that of the drain region and an impurity concentration lower than that in the drain region. Then it becomes possible to move more hot carriers generated between the floating gate electrode and the embedded drain region toward the surface of the semiconductor region.

In the second nonvolatile semiconductor memory device, it is preferable that it further comprises an embedded region adjacent lower area that is formed in the lower part of the embedded drain region in the semiconductor region and has a conduction type opposite to that of the drain region. Then it becomes possible to enhance the substrate bias effect.

In this case, it is preferable that the impurity concentration in the embedded region adjacent lower area is higher than that in the semiconductor region.

In the second nonvolatile semiconductor memory device, it is preferable that the semiconductor region has a stepped portion, the floating gate electrode is formed astride the stepped portion, and the drain region and embedded drain region are formed under the lower side of the the stepped portion. In this way, the electric field is strengthened in the neighborhood of the lower corner of the stepped portion area when a voltage is applied to the control gate electrode and the drain region. Since this concentration of the electric field provides a high electric field toward the drain region in the channel region, the hot electron generation efficiency is improved.

In the second nonvolatile semiconductor memory device, it is preferable that the carriers located in the channel region under the floating gate are subject to a force element of the electric field perpendicular to the surface of the semiconductor region when a predetermined voltage is applied to the control gate electrode or the drain region.

Further in the second nonvolatile semiconductor memory device, it is preferable that the control gate electrode is formed above the floating gate electrode.

Yet further in the second nonvolatile semiconductor memory device, it is preferable that the control gate electrode is formed on the semiconductor region in the vicinity of the side of the floating gate electrode.

A nonvolatile semiconductor memory device manufacturing method according to the present invention comprises the steps of: forming an embedded drain region by injecting a first impurity in a semiconductor region so that the top of the embedded drain region does not reach the main surface of the semiconductor region; forming a gate dielectric film on the main surface of the semiconductor region; forming first and second gate electrodes on the gate dielectric film so that the first gate electrode capacitively coupled with the second electrode is located above the embedded drain region; and injecting a second impurity into the semiconductor region, using the first and second gate electrodes as masks, to form a source region in the semiconductor region on one of side regions of the first and second gate electrodes, and a drain region in the other of the side regions thereof under the first gate electrode so that it contacts the embedded drain region.

According to the manufacturing method for the nonvolatile semiconductor memory device, the embedded drain region is formed inside the semiconductor region by injecting the first impurity into the semiconductor region so that its top does not reach the main surface of the semiconductor region. Later, the drain region is formed so as to contact the embedded drain region under the first gate electrode on the side region of the first and second gate electrodes. As a result, the second nonvolatile semiconductor memory device can be provided with reliability.

It is preferable that the nonvolatile semiconductor memory device manufacturing method further comprises the step of forming an embedded region adjacent upper area above a formation region to be formed as the embedded drain region in the semiconductor region by selectively injecting a third impurity having a conduction type opposite to that of the second impurity into the semiconductor region prior to the formation of the gate electrode.

It is preferable that the nonvolatile semiconductor memory device manufacturing method further comprises the step of forming an embedded region adjacent lower area under a formation region to be formed as the embedded drain region in the semiconductor region by selectively injecting a third impurity having a conduction type opposite to that of the second impurity into the semiconductor region prior to the formation of the gate electrode.

It is preferable that in the nonvolatile semiconductor memory device manufacturing method the step of forming the gate electrode includes the step of forming the second gate electrode above the first gate electrode via a capacitance dielectric film.

It is preferable that in the nonvolatile semiconductor memory device manufacturing method the step of forming the gate electrode includes the step of forming the first gate electrode on the side of the second gate electrode via a capacitance dielectric film.

It is preferable that the nonvolatile semiconductor memory device manufacturing method further comprises the step of forming a stepped portion above a formation region to be formed as the embedded drain region in the semiconductor region prior to the gate dielectric film formation step, so that the lower stage of the stepped portion is the side of the drain region, wherein the first gate electrode is formed astride the stepped portion in the gate electrode formation step.

It is preferable that the nonvolatile semiconductor memory device manufacturing method further comprises the step of forming a stepped portion above a formation region to be formed as the embedded drain region in the semiconductor region prior to the embedded drain region formation step, so that the lower stage of the stepped portion is the side of the drain region, wherein the first gate electrode is formed astride the stepped portion in the gate electrode formation step.

Further, it is preferable that in the nonvolatile semiconductor memory device manufacturing method the conduction type of the first impurity is the same as that of the second impurity and the concentration of the first impurity is lower than that of the second impurity.

Yet further, it is preferable that in the nonvolatile semiconductor memory device manufacturing method the conduction type of the first impurity is different from that of the second impurity and the concentration of the first impurity is lower than that of the third impurity.

BRIEF DESCRIPTION OF THE DRAWINGS

FIG. 1A is its sectional view; and FIG. 1B is a schematic view illustrating the direction of the electric force received by electrons near the channel region.

FIG. 3A is a graph of the potential along the C-D line in FIG. 3D (along the thickness direction of the substrate); FIG. 3B is a graph of the potential along the A-B line in FIG. 3D (along the direction parallel to the substrate); and FIG. 3C is a graph of the electric field strength along the A-B line in FIG. 3D.

FIG. 11B is its sectional view; and FIG. 11B is a schematic view illustrating the direction of the electric force received by electrons near the channel region.

FIG. 20A is its sectional view; and FIG. 20B is a graph showing the simulation results of the potential distribution near the channel region.

DETAILED DESCRIPTION OF THE INVENTION

[First Embodiment]

Referring now to the attached drawings, a first embodiment of the present invention will be described below.

Figure 1A:
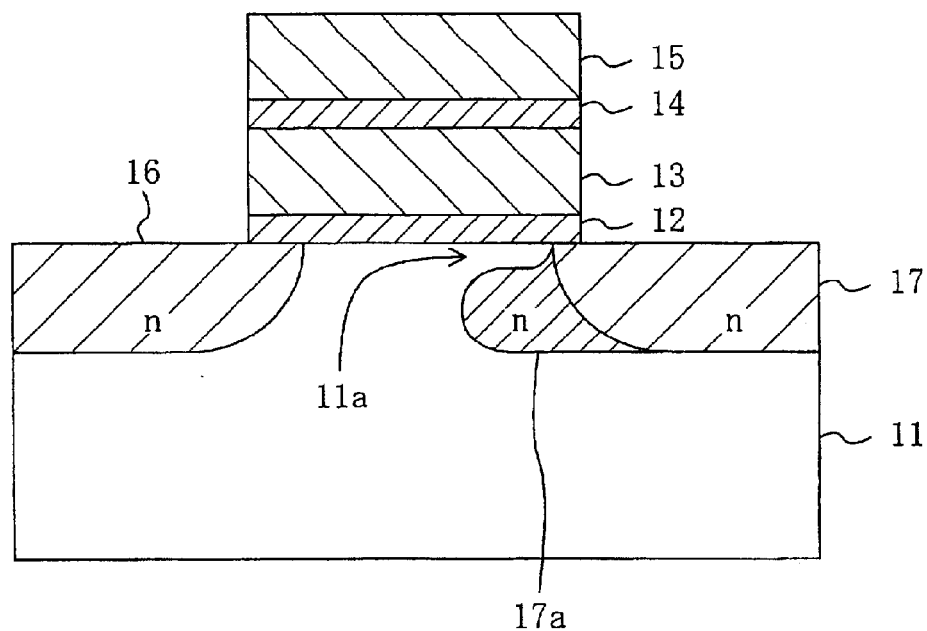
FIGS. 1A and 1B are schematic diagrams illustrating a nonvolatile semiconductor memory device according to a first embodiment of the present invention.

FIG. 1A illustrates a nonvolatile semiconductor memory device according to a first embodiment of the invention, specifically, the sectional view of an n-channel flash EEPROM.

Referring to FIG. 1A, a floating gate electrode 13 is formed on a p-type semiconductor substrate 11, for example, via a gate dielectric film 12 serving as a first dielectric film; and a control gate electrode 15 is formed on this floating gate electrode 13 via a capacitance dielectric film 14 serving as a second dielectric film. In the semiconductor substrate 11 on the side regions of the floating gate electrode 13, an n-type source region 16 and an n-type drain region 17 are formed, respectively. Further in the drain region 17, an embedded drain region 17a is formed that extends towards the source region 16 from the end of the drain region 17 faced with the source region 16, without reaching the surface of the semiconductor substrate 11. The impurity concentration in the embedded drain region 17a is lower than that in the drain region 17.

Now the operation of the nonvolatile semiconductor memory device of the above structure is described below.

First, during the writing operation for injecting carriers in the floating gate electrode 13, a voltage of about 5–7 V is applied to the drain region 17, a voltage of about 3–7 V is applied to the control gate electrode 15, and zero volt is applied to the source region 16 and the substrate electrode (not shown) providing the substrate potential.

Then a channel region 11a is formed near the surface of the substrate 11 above the embedded drain region 17a. Since a depletion layer lies around the drain region 17, a potential fall arises in the channel region 11a from the side of the drain region 17 along the substrate toward the source region 16, and then an electric field is formed in the direction parallel to the substrate. The energy of carriers is raised by this electric field along the substrate and the high energy carriers (hot carriers) are injected into the floating gate electrode 13.

Figure 1B:
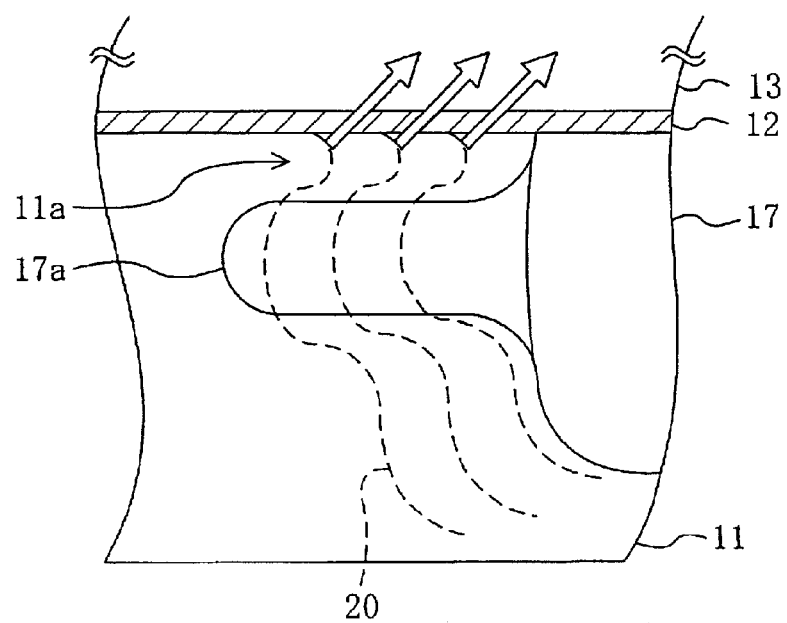

In the first embodiment of the invention, as shown in FIG. 1B that is an enlarged schematic drawing of the embedded drain region 17a and the channel region 11a in the semiconductor substrate 11, the top of the embedded drain region 17a does not reach the substrate surface in the channel region 11a of the semiconductor substrate 11. As a result, due to the spread of the depletion layer made by the voltage applied to the drain region 17 (drain voltage) and the voltage applied to the control gate electrode 15 (control gate voltage), the isoelectric lines 20 bend in the direction parallel to the substrate near the substrate surface. The carriers (electrons) running near the substrate surface in the channel region 11a are placed in an electric field having an element perpendicular to the substrate, driven by the bent isoelectric lines 20. Then the electrons are subject to an external force having an upward element perpendicular to the substrate, as shown by the arrow in FIG. 1B. Since the floating gate electrode 13 is formed in the direction of the arrow, the electron injection efficiency is raised.

Next, during the erasing operation, a voltage of about −6 to −8V is applied to the control gate electrode 15, a voltage of about 7–10V is applied to the drain region 17, and zero volt is applied to the source region 16 and the substrate electrode providing the substrate potential. The electrons stored in the floating gate electrode 13 are pulled out to the drain region 17 through the gate dielectric film 12, driven by the above voltage application. At this time, as well known as the Fouler-Nordheim (FN) type tunneling phenomenon, the electrons stored in the floating gate electrode 13 pass through the gate dielectric film 12.

During the readout operation, a voltage of 3–5V is applied to the control gate electrode 15, a voltage of 2–4V is applied to the drain region 17, and zero volt is applied to the source region 16 and the substrate electrode. Since the threshold voltage for readout is changed to relatively higher value and lower value according to the number of carriers stored in the floating gate electrode 13, the readout voltage can be used as data if the voltage magnitudes have been correlated with the predetermined data.

In the description that follows, the effect of the embedded drain region 17a that is formed under the floating gate electrode 13 to extend from the end of the drain region 17 faced with the source region 16 towards the source region 16, without reaching the substrate surface, is shown by computer simulation.

Figure 2:
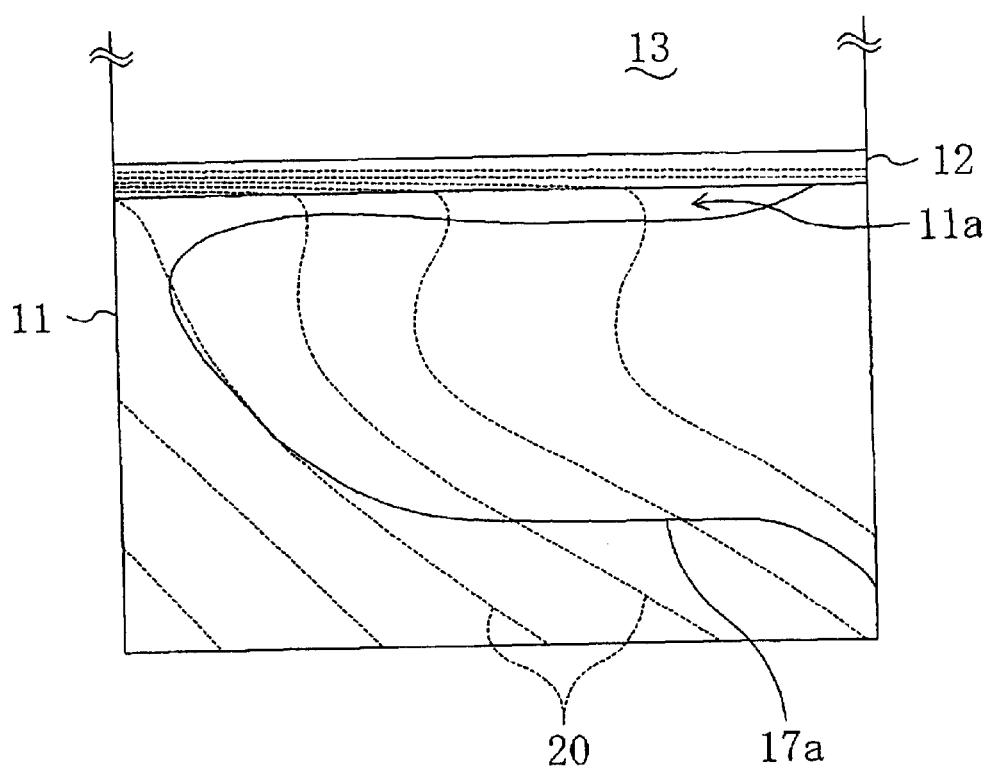
FIG. 2 is a diagram illustrating the simulation results of potential distribution near the channel region of the nonvolatile semiconductor memory device according to the first embodiment of the present invention.

FIG. 2 shows a two-dimensional numerical analysis of the distribution of isoelectric lines in the vicinity of the embedded drain region 17a in the nonvolatile semiconductor memory device according to the first embodiment of the present invention. As shown in FIG. 2, the isoelectric lines 20 bend in the direction parallel to the substrate, in the channel region 11a that is formed near the surface of the substrate 11 above the embedded drain region 17a.

As described before, since the electrons running in the channel region 11a are subject to an external force having an upward element perpendicular to the substrate and the floating gate electrode 13 is formed in the direction of this external force, the carrier injection efficiency can be raised.

Figure 3A:
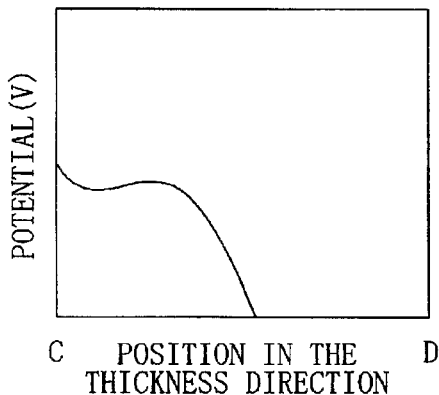
FIGS. 3A–3C are the diagrams illustrating the simulation results of potential and electric field strength in the channel region of the nonvolatile semiconductor memory device according to the first embodiment of the present invention.
Figure 3C:
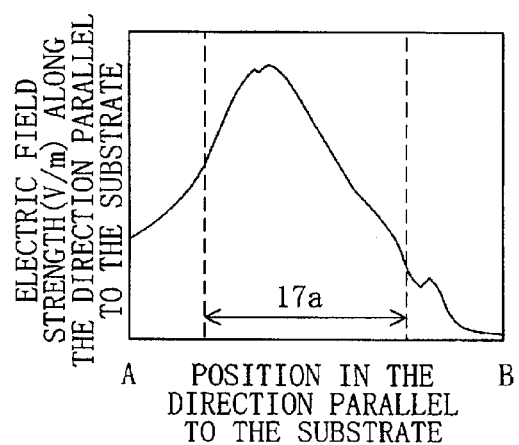
Figure 3B:
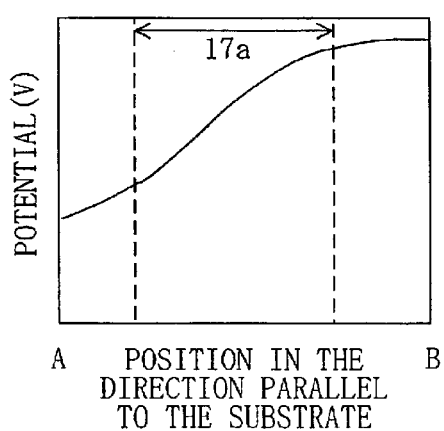
Figure 3D:
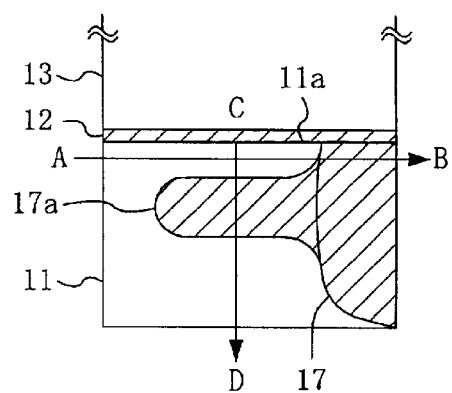
FIG. 3D is an enlarged sectional view of the channel region and its vicinity.

FIG. 3A shows the one dimensional potential distribution in the lower part of the floating gate electrode 13 (in the vertical direction) in the semiconductor substrate 11; FIGS. 3B and 3C demonstrate the distributions of potential and electric field, respectively, in the horizontal direction in the channel region 11a formed between the embedded drain region 17a and the substrate surface. FIG. 3A is drawn with the horizontal axis along the C-D line in FIG. 3D; FIGS. 3B and 3C are drawn with the horizontal axis along the A-B line of FIG. 3D. What is denoted 17a in FIGS. 3B and 3C is the upper area corresponding to the embedded drain region 17a.

As shown in FIG. 3A, the potential decreases to a certain depth from the substrate surface and then increases. The channel region 11a is formed in the place that shows a local maximum of the potential curve. Specifically, the most stable part of the channel region 11a lies in between the substrate surface and the embedded drain region 17a. As a result, the channel region 11a is formed near the substrate surface. Meanwhile, electrons experience an upward force by the electric field perpendicular to the substrate, in the area where the potential declines in the vertical direction. Thus the force applied to the electrons (channel electrons) in the channel region 11a by the electric field generated in the channel region 11a is directed upward and perpendicular to the substrate.

In this way the embedded drain region 17a is formed under the floating gate electrode 13, namely, under the channel region 11a. Then the channel electrons are subject to the external force having an element directed to the floating gate electrode 13, and the efficiency of electron injection to the floating gate electrode 13 is improved. As a result, the writing speed is raised and the writing operation becomes faster.

Referring now to FIG. 3B, the potential drops from the drain side (B) toward source side (A) in the channel region 11a that is formed above the embedded drain region 17a. Then hot electrons are created in a wide range over the channel region 11a.

Further as shown in FIG. 3C, since the peak in electric field strength lies on the side of the source (A) in the channel region 11a, it becomes difficult to intake the created hot electrons in the drain region 17. Thus the injection efficiency of hot electrons to the floating gate electrode 13 is raised.

Next explained is another reason why the embedded drain region 17a is formed so as not to reach the substrate surface.

First, when data is written in, there occurs a potential drop in the upper part of the embedded drain region 17a in the channel region 11a from the side of the drain region 17 toward the source region 16. As a result, the potential of this part becomes much lower than the voltage applied to the drain region 17. Then the potential difference grows between the upper part of the embedded drain region 17a in the channel region 11a where electrons are raised to a high energy state and the floating gate electrode 13, and electrons are likely to be electrically attracted to the floating gate electrode 13. The injection efficiency of electrons to the floating gate electrode 13 is thereby raised.

Since channel electrons experience the external force having an element directed to the floating gate electrode 13 and the potential difference grows between the upper part of the embedded drain region 17a in the channel region 11a and the floating gate electrode 13, the injection efficiency of electrons to the floating gate electrode 13 is drastically raised. Thus, if the applied voltage to the control gate is lowered, the writing operation can be conducted at high speed.

In the nonvolatile semiconductor memory device of the prior art, electrons are accumulated in the floating gate electrode 13 as the writing operation proceeds, and then the potential of the floating gate electrode 13 gradually falls. As a result, the electron injection efficiency declines, compared with that at early stages of writing operation.

Figure 4:
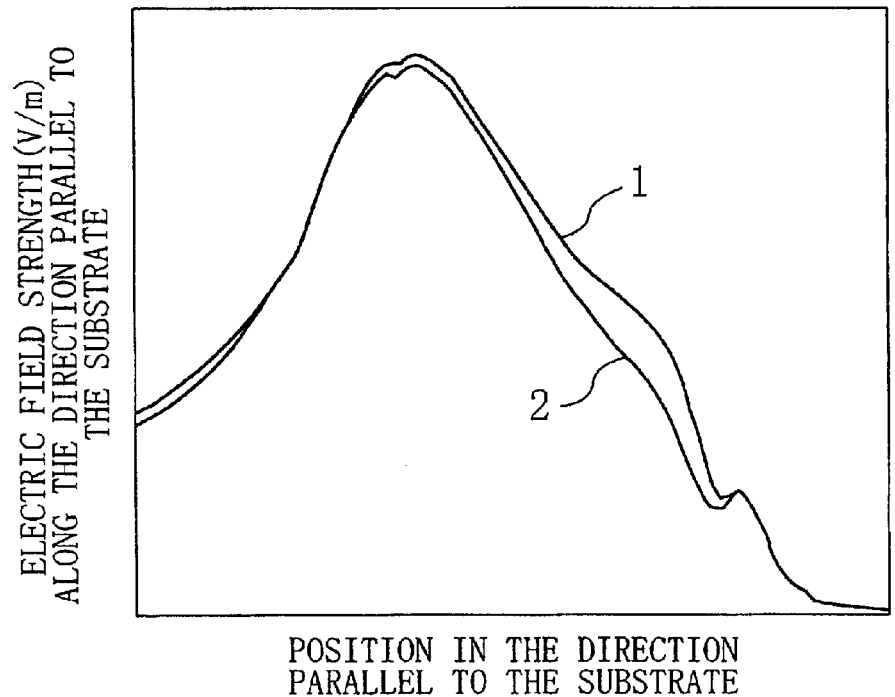
FIG. 4 is a graph illustrating the simulation results of how the potential of the floating gate influences the electric field strength in the horizontal direction in the channel region of the nonvolatile semiconductor memory device according to the first embodiment of the present invention.

However, as indicated by the graph of FIG. 4 that illustrates by a two-dimensional numerical analysis how the electric field strength along the horizontal direction depends on the potential of the floating gate electrode, the electric field created in the channel region in the horizontal direction becomes stronger when the potential of the floating gate electrode 13 is lower, as shown by curve 1, compared with that provided when the potential of the floating gate electrode 13 is higher, as shown by curve 2, in the nonvolatile semiconductor memory device according to the first embodiment of the invention.

In this way, even when the potential of the floating gate electrode 13 falls as the writing operation proceeds in the first embodiment, the electric field becomes even stronger. Thus it becomes possible to perform writing operation at high speed.

Next explained is the effect provided during the readout operation.

As shown in FIG. 1A, since the channel region 11a is formed above the embedded drain region 17a, the channel region 11a formed under the floating gate electrode 13 in the semiconductor substrate 11 may be extended along the gate. Then the magnitude of change in the threshold voltage level of the memory cell itself is magnified by the amount of the charge accumulated in the floating gate electrode 13. As a result, the data readout operation can be performed at high speed with high reliability.

Next explained are the characteristics of the writing operation and the erasing operation.

During the writing operation, since a high electric field is created above the embedded drain region 17a as shown in FIG. 3C, electrons pass above the embedded drain region 17a in the gate dielectric film 12. Meanwhile, during the erasing operation, there runs an FN-tunnel current in the area of the gate dielectric film 12 contacting the drain region 17 as shown in FIG. 1, in particular, at the end of the gate dielectric film 12 faced with the drain region 17. In this way, since electrons are pulled out of the gate dielectric film 12 during data erasing in an area different from the area where electrons are injected during data writing, the gate dielectric film 12 is unlikely to degrade, providing high reliability over a long term.

As described so far, it becomes possible to raise the electron injection efficiency without raising the control gate voltage by forming the embedded drain region 17a under the floating gate electrode 13 so that its upper end does not reach the substrate surface. In addition, the reliability of the gate dielectric film 12 and readout performance can be improved.

It should be noted that the device according to the first embodiment may have a so-called split-gate type gate electrode structure where the control gate electrode and the floating gate electrode are neighboring to each other via a capacitance dielectric film, instead of a so-called stacked gate type gate electrode structure where the gate dielectric film 12, floating gate electrode 13, capacitance dielectric film 14 and control gate electrode 15 are sequentially deposited on the semiconductor substrate 11. The first embodiment does not depend on the gate structure.

The material for the semiconductor substrate 11 is not limited to a specific material; however, silicon (Si) is a preferable material. The SOI substrate may be used and its shape is not limited to a plate-like one. It may be any substrate including a semiconductor region having a well where the source region 16 and the drain region 17 can be formed.

Now explained below is the manufacturing method of the nonvolatile semiconductor memory device according to the first embodiment of the invention.

FIGS. 5A–5D are sectional views of the respective steps in the manufacturing process for the nonvolatile semiconductor memory device according to the first embodiment of the present invention.

Figure 5A:
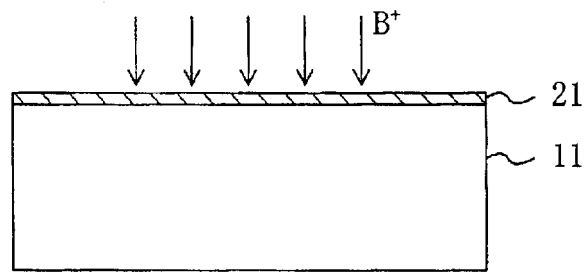
FIGS. 5A–5D are sectional views of the respective steps in a manufacturing process for the nonvolatile semiconductor memory device according to the first embodiment of the present invention.

First as shown in FIG. 5A, a protective oxide film 21 made of silicon oxide is formed by the thermal oxidation method, CVD method or other techniques on the main surface of the semiconductor substrate 11, for example, made of silicon (Si), to protect the surface of the semiconductor substrate 11. Subsequently, boron (B) ions are injected into the semiconductor substrate 11, which is the p-type impurity used for controlling the threshold voltage.

Figure 5B:
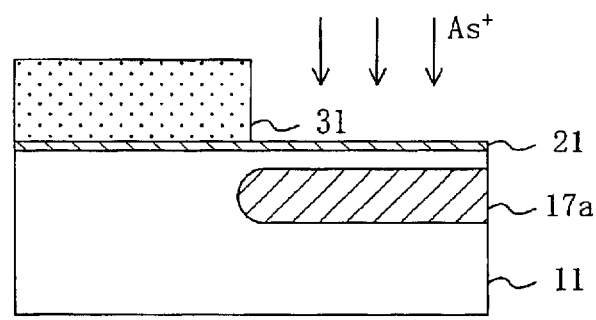

Next as shown in FIG. 5B, a resist mask pattern 31 having an opening for exposing the drain formation region is formed on the semiconductor substrate 11 by the photolithography method. Subsequently, with the fabricated mask pattern 31 being used, arsenic (As) ions serving as an n-type impurity are injected into the semiconductor substrate 11, at an injection energy of about 20 keV–50 keV and a dose of about $1.0 \times 10^{13}/cm^2$–$1.0 \times 10^{14}/cm^2$. In this way, the embedded drain region 17a is formed in a location deep from the substrate surface.

Figure 5C:
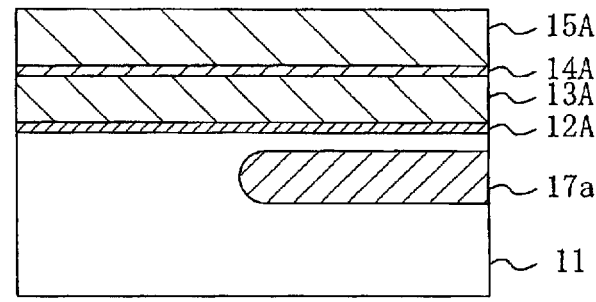

Next as shown in FIG. 5C, the mask pattern 31 and the protective oxide film 21 are removed, and then a gate dielectric formation film 12A which is about 11 nm in thickness and made of silicon oxide is formed on the main surface of the semiconductor substrate 11 by the thermal oxidation method or the like. Subsequently, a first gate electrode formation film 13A which is about 0.1 μm in thickness and made of poly-silicon is deposited on the gate dielectric formation film 12A by the low-pressure CVD method or the like. In addition, a capacitance dielectric formation film 14A which is about 13 nm thick and made of silicon oxide or silicon nitride or the like is formed on the first gate electrode formation film 13A; and on the formed capacitance dielectric formation film 14A a second gate electrode formation film 15A which is about 0.1 μm thick and made of poly-silicon is deposited.

Figure 5D:
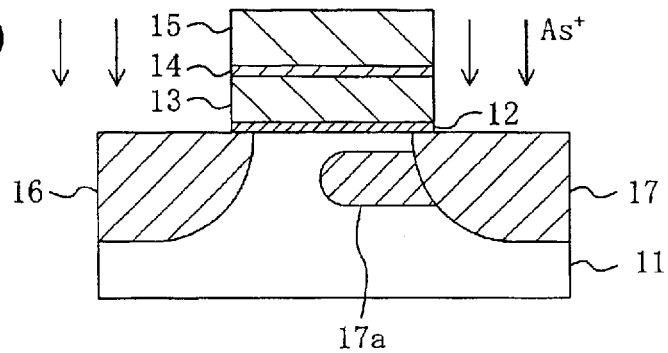

Next, as shown in FIG. 5D, the second gate electrode formation film 15A, capacitance dielectric formation film 14A, first gate electrode formation film 13A and gate dielectric formation film 12A are selectively etched for patterning to form the control gate electrode 15 from the gate electrode formation film 15A, the capacitance dielectric film 14 from the capacitance dielectric formation film 14A, the floating gate electrode 13 from the first gate electrode formation film 13A and the gate dielectric film 12 from the gate dielectric formation film 12A. At this time, the floating gate electrode 13 is formed above the end of the embedded drain region 17a faced with the source formation region.

Subsequently, with the control gate electrode 15 and the floating gate electrode 13 at least being used as masks, the source region 16 is formed in the source formation region in the semiconductor substrate 11, by injecting arsenic (As) ions at an injection energy of about 50 keV and a dose of about $3.0 \times 10^{15}/cm^2$ in the semiconductor substrate 11; and then the drain region 17 is formed in the drain formation region so as to be connected to the embedded drain region 17a under the floating gate electrode 13.

In this way, according to the manufacturing method of the first embodiment of the invention, the embedded drain region 17a that has a predetermined impurity profile and is connected to the drain region 17 is formed under the floating gate electrode 13 in the semiconductor substrate 11.

[Second Embodiment]

Now referring to the attached drawings, a second embodiment of the present invention is described below.

Figure 6:
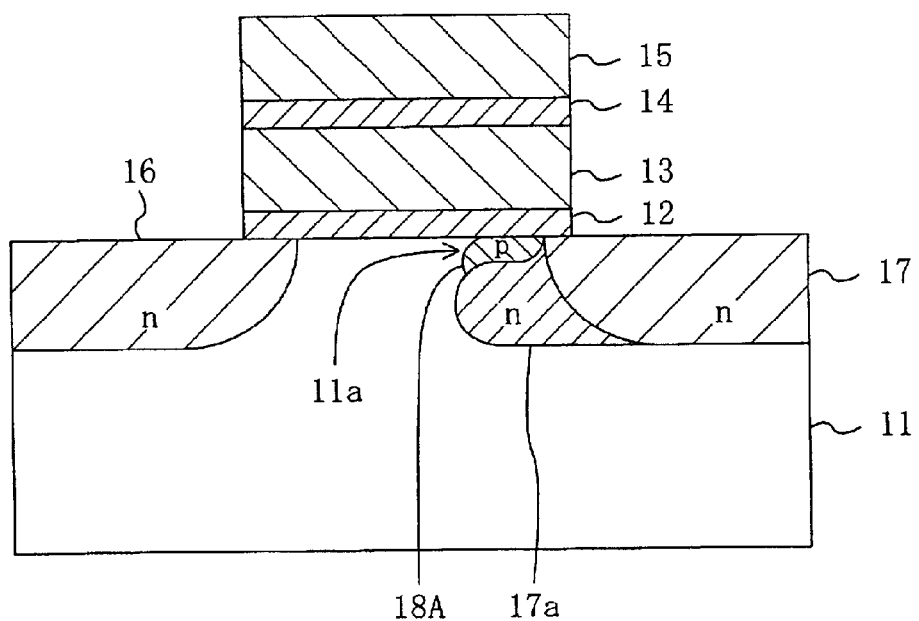
FIG. 6 is a sectional view of a nonvolatile semiconductor memory device according to a second embodiment of the present invention.

FIG. 6 is a sectional view of a nonvolatile semiconductor memory device according to a second embodiment of the present invention, specifically, the sectional structure of an n-type channel flash EEPROM. In FIG. 6, the same components as those in FIG. 1A have the same numerals and their explanation is not repeated.

Referring now to FIG. 6, the nonvolatile semiconductor memory device according to the second embodiment of the invention has a p-type embedded region adjacent upper area 18A formed on the top of the embedded drain region 17a in the semiconductor substrate 11. The concentration of the p-type impurity in this embedded region adjacent upper area 18A is set at a value greater than that in the p-type impurity contained in the semiconductor substrate 11.

According to the second embodiment, in addition to the same effect as that provided in the first embodiment, another advantage is provided. Namely, since the embedded region adjacent upper area 18A of an impurity concentration higher than that in the semiconductor substrate 11 is formed on the embedded drain region 17a, a large potential difference is created by the pn junction between this embedded region adjacent upper area 18A and the drain region 17. Then the electric field created in the upper part of the embedded drain region 17a becomes strong in the channel region 11a in the direction parallel to the substrate. As a result, the hot electron generation efficiency and the writing speed become higher.

In this time, if a negative voltage as the substrate bias voltage is applied to the semiconductor substrate 11, the substrate potential is lowered and then the potential difference grows between the upper part of the embedded drain region 17a in the channel region 11a and the floating gate electrode 13. As a result, since channel electrons are likely to be electrically attracted to the floating gate electrode 13, the electron injection efficiency is raised.

Further, since the embedded region adjacent upper area 18A formed on the top of the embedded drain region 17a includes the channel region 11a, the magnitude of the threshold voltage of the memory cell can be set at a desired level by controlling the impurity concentration in the embedded region adjacent upper area 18A.

It should be noted that the device according to the second embodiment may have a so-called split-gate type gate electrode structure where the control gate electrode and the floating gate electrode are neighboring to each other via a capacitance dielectric film, instead of the stacked gate type gate electrode structure, namely independent of the gate structure.

The material for the semiconductor substrate 11 is not limited to a specific material; however, silicon (Si) is a preferable material. The SOI substrate may be used and its shape is not limited to a plate-like one. It may be any substrate including a semiconductor having a well where the source region 16 and the drain region 17 can be formed.

Now explained below is the manufacturing method of the nonvolatile semiconductor memory device according to the second embodiment of the invention.

FIGS. 7A–7D are sectional views of the respective steps in the manufacturing process for the nonvolatile semiconductor memory device according to the second embodiment of the present invention.

Figure 7A:
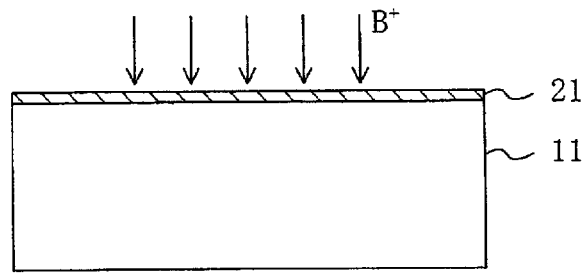
FIGS. 7A–7D are sectional views of the respective steps in a manufacturing process for the nonvolatile semiconductor memory device according to the second embodiment of the present invention.

First as shown in FIG. 7A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage.

Figure 7B:
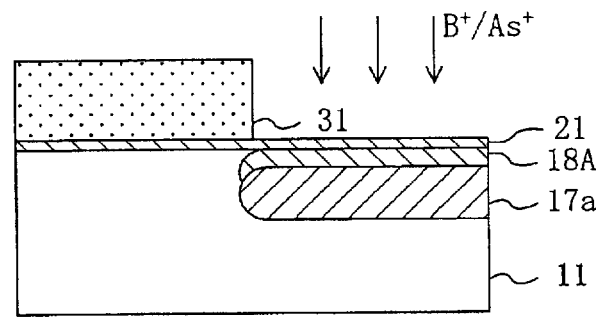

Next as shown in FIG. 7B, a resist mask pattern 31 having an opening for exposing the drain formation region is formed on the semiconductor substrate 11 by the photolithography method. Subsequently, with the fabricated mask pattern 31 being used, boron (B) ions serving as a p-type impurity are injected into the semiconductor substrate 11, at an injection energy of about 10 keV-30 keV and a dose of about $1.0 \times 10^{12}/cm^2$–$1.0 \times 10^{13}/cm^2$. In this way, the embedded region adjacent upper area 18A is formed in a location shallow from the substrate surface.

Subsequently, with the fabricated mask pattern 31 being used, arsenic (As) ions serving as an n-type impurity are injected into the semiconductor substrate 11, at an injection energy of about 20 keV-50 keV and a dose of about $1.0×10^{13}/cm^2–1.0×10^{14}/cm^2$. In this way, the embedded drain region 17a is formed in a location deep from the substrate surface so as to contact the embedded region adjacent upper area 18A.

Figure 7C:
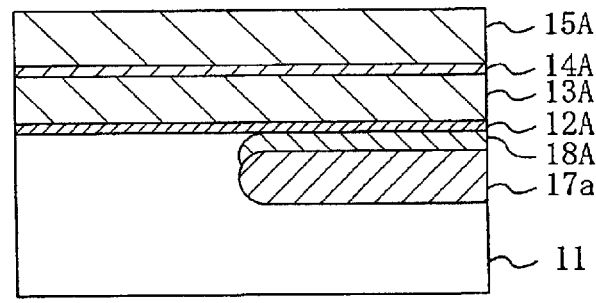

Next as shown in FIG. 7C, the mask pattern 31 and the protective oxide film 21 are removed, and then the gate dielectric formation film 12A which is about 11 nm in thickness and made of silicon oxide is formed on the main surface of the semiconductor substrate 11 by the thermal oxidation method or the like. Subsequently, the first gate electrode formation film 13A which is about 0.1 μm in thickness and made of poly-silicon is deposited on the gate dielectric formation film 12A by the low-pressure CVD method or the like. In addition, the capacitance dielectric formation film 14A which is about 13 nm thick and made of silicon oxide or silicon nitride or the like is formed on the first gate electrode formation film 13A; and on the formed capacitance dielectric formation film 14A the second gate electrode formation film 15A which is about 0.1 μm thick and made of poly-silicon is deposited.

Figure 7D:
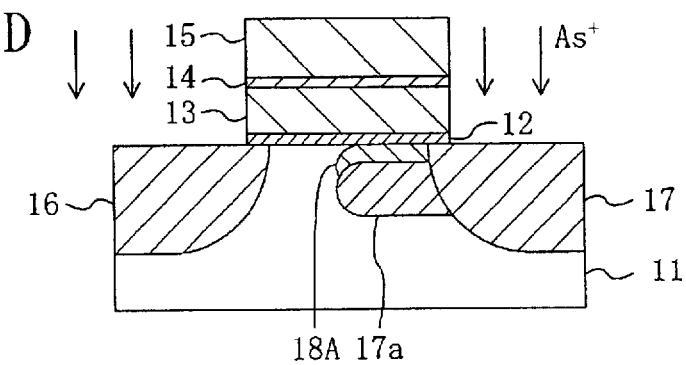

Next, as shown in FIG. 7D, the second gate electrode formation film 15A, capacitance dielectric formation film 14A, first gate electrode formation film 13A and gate dielectric formation film 12A are selectively etched for patterning to form the control gate electrode 15 from the second gate electrode foramtion film 15A, the capacitance dielectric film 14 from the capacitance dielectric formation film 14A, the floating gate electrode 13 from the first gate electrode formation film 13A and the gate dielectric film 12 from the gate dielectric formation film 12A. At this time, the floating gate electrode 13 is formed to be located above the end of the embedded drain region 17a faced with the source formation region.

Subsequently, with the control gate electrode 15 and the floating gate electrode 13 at least being used as masks, the source region 16 is formed in the source formation region in the semiconductor substrate 11, by injecting arsenic (As) ions at an injection energy of about 50 keV and a dose of about $3.0×10^{15}/cm^2$ in the semiconductor substrate 11; and then the drain region 17 is formed in the drain formation region so as to be connected to the embedded drain region 17a under the floating gate electrode 13.

In this way, according to the manufacturing method of the second embodiment of the invention, the embedded drain region 17a that has a predetermined impurity profile and is connected to the drain region 17 is formed under the floating gate electrode 13 in the semiconductor substrate 11. In addition, the embedded region adjacent upper area 18A can be formed over the embedded drain region 17a.

In the present embodiment, the embedded region adjacent upper area 18A was formed before the embedded drain region 17a; however, this process sequence is not fixed.

[Third Embodiment]

Now referring to the attached drawings, a third embodiment of the present invention is described below.

Figure 8:
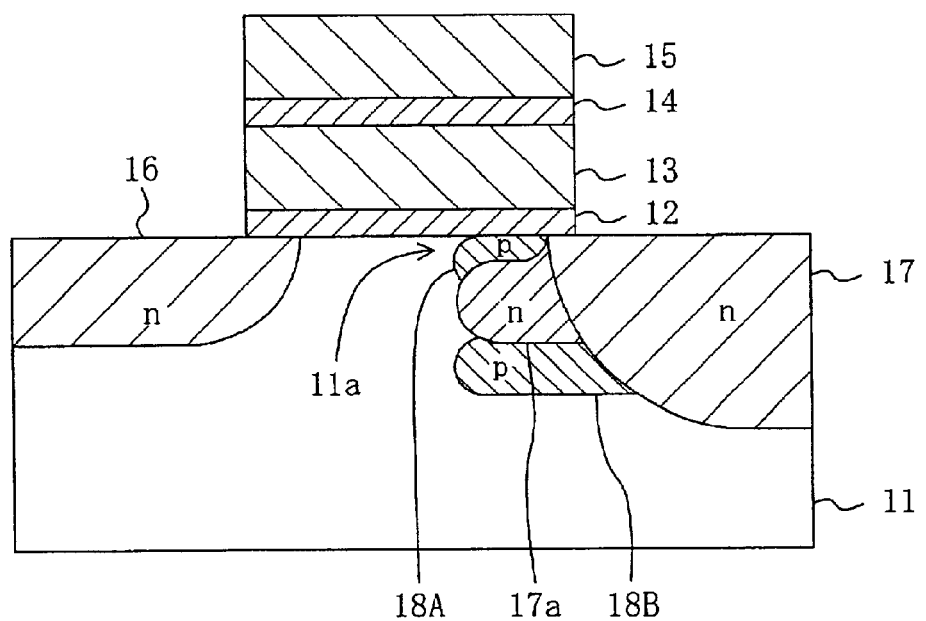
FIG. 8 is a sectional view of a nonvolatile semiconductor memory device according to a third embodiment of the present invention.

FIG. 8 is a sectional view of the nonvolatile semiconductor memory device according to the third embodiment of the present invention, specifically, the sectional structure of an n-type channel flash EEPROM. In FIG. 8, the same components as those in FIG. 6 have the same numerals and their explanation is not repeated.

Referring now to FIG. 8, the nonvolatile semiconductor memory device according to the third embodiment of the invention has a p-type embedded region adjacent upper area 18A formed on the top of the embedded drain region 17a in the semiconductor substrate 11 and a p-type embedded region adjacent lower area 18B that is formed under the embedded drain region 17a. The concentration of the p-type impurity in this embedded region adjacent upper area 18B is set at a value greater than that of the p-type impurity contained in the semiconductor substrate 11.

According to the third embodiment, in addition to the same effect as that provided in the second embodiment, another advantage is provided. Namely, the hot electron generation efficiency can be drastically raised when a substrate bias voltage is applied to the semiconductor substrate 11.

Figure 9:
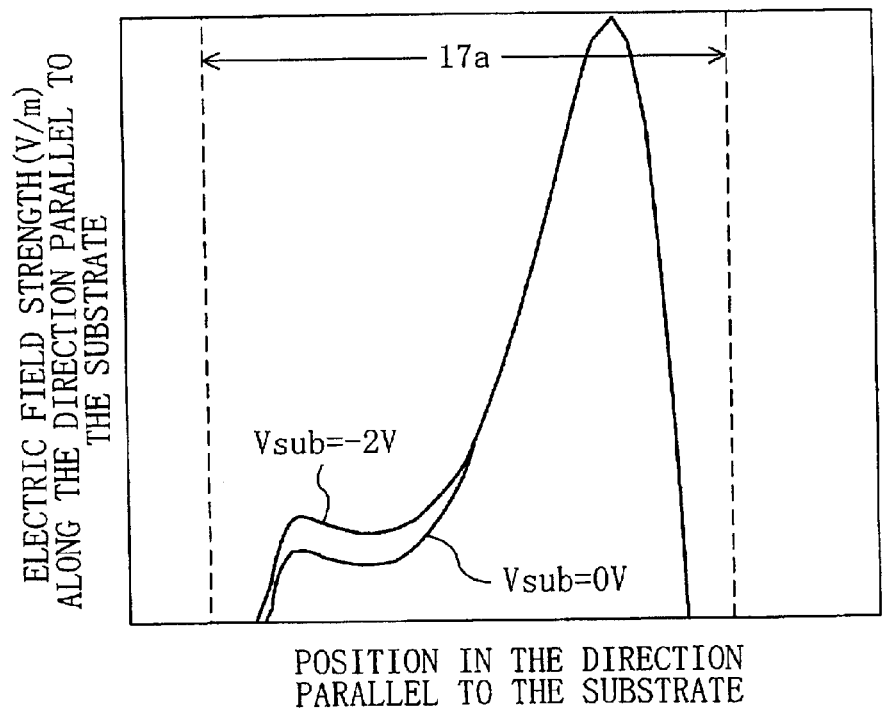
FIG. 9 is a graph illustrating the computer simulation of the strength of electric field created during writing operation in the direction parallel to the substrate in the channel region of the nonvolatile semiconductor memory device according to the third embodiment of the present invention.

FIG. 9 is a graph illustrating the computer simulation of the strength of electric field created in the upper part of the embedded drain region 17a during writing operation in the direction parallel to the substrate in the channel region 11a. What is denoted by 17a corresponds to the upper region corresponding to the embedded drain region 17a. This graph shows the results provided when −2V and 0V (ground potential) are applied as the substrate bias voltage, Vsub. As shown in FIG. 9, when the embedded region adjacent upper area 18A is formed over the embedded drain region 17a and the embedded region adjacent lower area 18B is formed under the embedded drain region 17a, the strength of the electric field created in the direction parallel to the substrate in the upper part of the embedded drain region 17a in the channel region 11a becomes higher when a negative bias voltage is applied to the substrate than that provided when the ground potential is applied. As a result, since the hot electron generation efficiency in the channel region 11a is further raised, the writing speed becomes higher.

As described before, if a negative bias voltage is applied to the substrate, the potential difference is enlarged by the pn junction between the embedded region adjacent upper area 18A and the drain region 17. Then a high electric field appears in the upper part of the embedded drain region 17a in the channel region 11a.

Meanwhile, when the embedded region adjacent lower area 18B is formed under the embedded drain region 17a, the electrical connection between the semiconductor substrate 11 and the embedded region adjacent upper area 18A is strengthened, and then the substrate potential is likely to act on the embedded region adjacent upper area 18A.

According to the third embodiment, the hot electron injection efficiency is drastically raised by applying a negative voltage to the semiconductor substrate 11 as a substrate bias voltage, with no need to raise the drain voltage. Besides, the efficiency of electron injection to the floating gate 13 is also improved without raising the control gate voltage.

It should be noted that the device according to the third embodiment may have the split-gate type gate electrode structure, instead of the stacked gate type gate electrode structure, namely independent of the gate structure.

The material for the semiconductor substrate 11 is not limited to a specific material; however, silicon (Si) is a preferable material. The SOI substrate may be used and its shape is not limited to a plate-like one. It may be any substrate including a semiconductor having a well where the source region 16 and the drain region 17 can be formed.

Now explained below is the manufacturing method of the nonvolatile semiconductor memory device according to the third embodiment of the invention.

FIGS. 10A–10D are sectional views of the respective steps in the manufacturing process for the nonvolatile semiconductor memory device according to the third embodiment of the present invention.

Figure 10A:
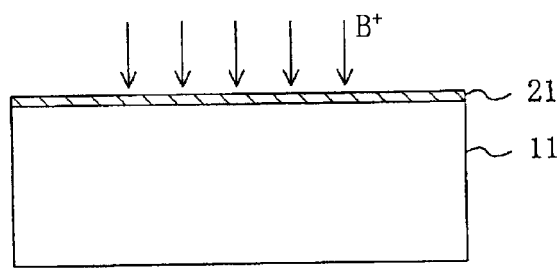
FIGS. 10A–10D are sectional views of the respective steps in a manufacturing process for the nonvolatile semiconductor memory device according to the third embodiment of the present invention.

First as shown in FIG. 10A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage.

Figure 10B:
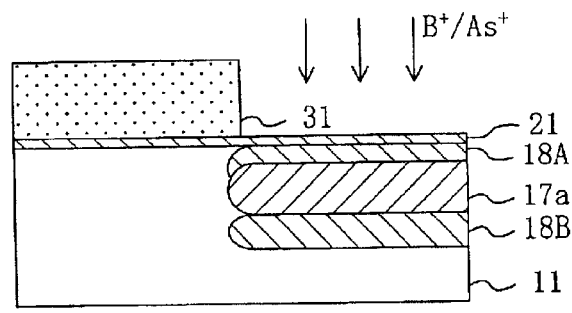

Next as shown in FIG. 10B, a resist mask pattern 31 having an opening for exposing the drain formation region is formed on the semiconductor substrate 11 by the photolithography method. Subsequently, with the fabricated mask pattern 31 being used, boron (B) ions serving as a p-type impurity are injected into the semiconductor substrate 11, at an injection energy of about 10 keV-30 keV and a dose of about $1.0 \times 10^{12}/cm^2 - 1.0 \times 10^{13}/cm^2$. In this way, the embedded area neighboring region 18A is formed in a shallow location in the semiconductor substrate 11. Subsequently, with the fabricated mask pattern 31 being used, boron (B) ions are injected at an injection energy higher than that adopted in forming the embedded region adjacent upper area 18A, namely, about 30 keV-50 keV and a dose of about $1.0 \times 10^{12}/cm^2 - 1.0 \times 10^{13}/cm^2$. In this way, the embedded region adjacent lower area 18B is formed so that its top is located in the bottom of or under the region to be formed as the embedded drain region.

Subsequently, with the fabricated mask pattern 31 being used, arsenic (As) ions serving as an n-type impurity are injected into the semiconductor substrate 11, at an injection energy of about 20 keV-50 keV and a dose of about $1.0 \times 10^{13}/cm^2 - 1.0 \times 10^{14}/cm^2$. In this way, the embedded drain region 17a is formed between the embedded region adjacent upper area 18A and the embedded region adjacent lower area 18B.

Figure 10C:
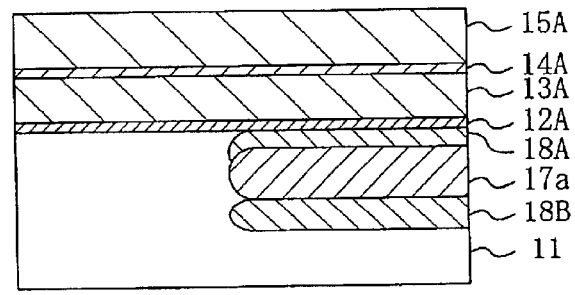

Next as shown in FIG. 10C, the mask pattern 31 and the protective oxide film 21 are removed, and then the gate dielectric formation film 12A which is about 11 nm in thickness and made of silicon oxide is formed on the main surface of the semiconductor substrate 11 by the thermal oxidation method or the like. Subsequently, the first gate electrode formation film 13A which is about 0.1 μm in thickness and made of poly-silicon is deposited on the gate dielectric formation film 12A by the low-pressure CVD method or the like. In addition, the capacitance dielectric formation film 14A which is about 13 nm thick and made of silicon oxide or silicon nitride or the like is formed on the first gate electrode formation film 13A; and on the formed capacitance dielectric formation film 14A the second gate electrode formation film 15A which is about 0.1 μm thick and made of poly-silicon is deposited.

Figure 10D:
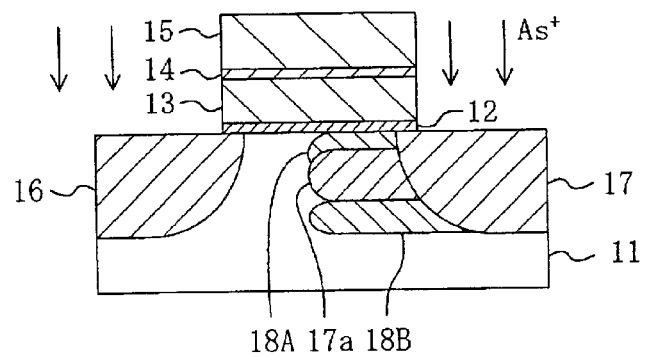

Next, as shown in FIG. 10D, the second gate electrode formation film 15A, capacitance dielectric formation film 14A, first gate electrode formation film 13A and gate dielectric formation film 12A are selectively etched for patterning to form the control gate electrode 15 from the second gate electrode formation film 15A, the capacitance dielectric film 14 from the capacitance dielectric formation film 14A, the floating gate electrode 13 from the first gate electrode formation film 13A and the gate dielectric film 12 from the gate dielectric formation film 12A. At this time, the floating gate electrode 13 is formed to be located above the end of the embedded drain region 17a faced with the source formation region.

Subsequently, with the control gate electrode 15 and the floating gate electrode 13 at least being used as masks, the source region 16 is formed in the source formation region in the semiconductor substrate 11, by injecting arsenic (As) ions at an injection energy of about 50 keV and a dose of about $3.0 \times 10^{15}/cm^2$ in the semiconductor substrate 11; and then the drain region 17 is formed in the drain formation region so as to be connected to the embedded drain region 17a under the floating gate electrode 13.

In this way, according to the manufacturing method of the third embodiment of the invention, the embedded drain region 17a that has a predetermined impurity profile and is connected to the drain region 17 is formed under the floating gate electrode 13 in the semiconductor substrate 11. In addition, the embedded region adjacent upper area 18A can be formed over the embedded drain region 17a, and the embedded region adjacent lower area 18B is formed under the embedded drain region 17a.

In the present embodiment, the fabrication sequence for the embedded region adjacent upper area 18A, the embedded region adjacent lower area 18B and the embedded drain region 17a is not fixed.

[Fourth Embodiment]

Now referring to the attached drawings, a fourth embodiment of the present invention is described below.

Figure 11A:
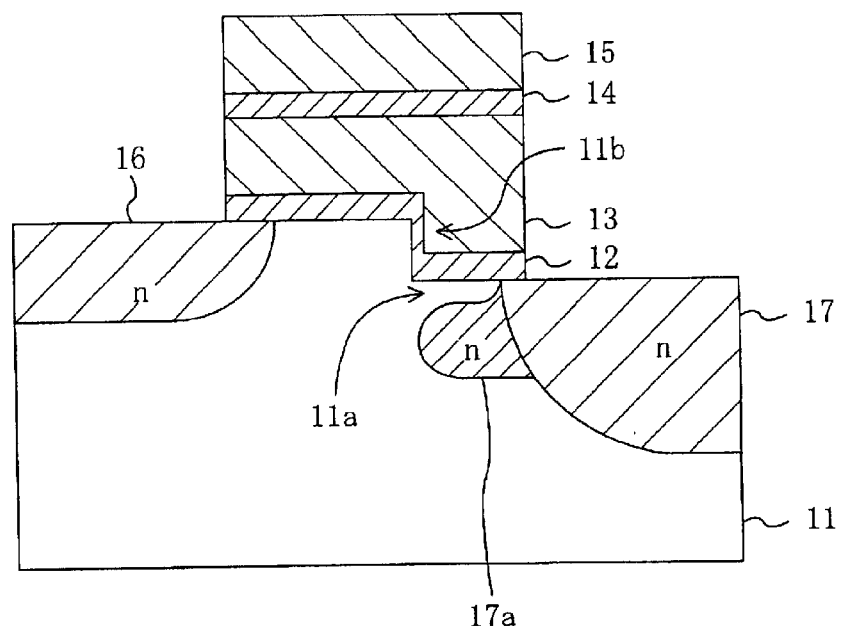
FIGS. 11A and 11B are schematic diagrams illustrating a nonvolatile semiconductor memory device according to a fourth embodiment of the present invention.

FIG. 11A is a sectional view of the nonvolatile semiconductor memory device according to the fourth embodiment of the present invention, specifically, the sectional structure of an n-type channel flash EEPROM. In FIG. 11A, the same components as those in FIG. 1A have the same numerals and their explanation is not repeated.

The nonvolatile semiconductor memory device according to the fourth embodiment has a stepped portion 11b in the floating gate electrode 13 in the semiconductor substrate 11. The floating gate electrode 13 is formed astride the stepped potion 11b. The source region 16 is formed in the upper stage of the stepped portion 11b, while the drain region 17 is formed in the lower stage of the stepped portion 11b. The top end of the embedded drain region 17a does not reach the surface of the lower stage of the stepped portion 11b. At the same time, the side end of the embedded drain region 17a facing the source region 16 is located almost directly below the standing wall of the stepped portion 11b. The gate dielectric film 12 is formed on the standing wall of the stepped portion 11b as well.

Figure 11B:
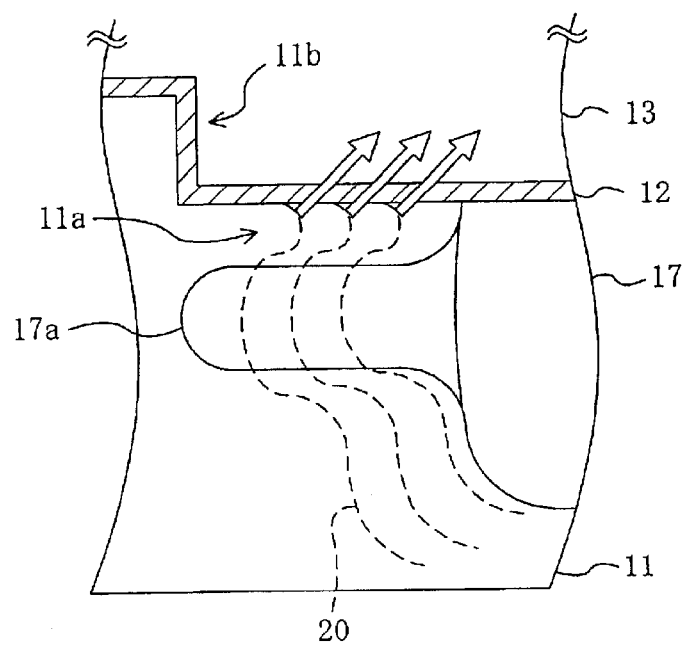

This structure provides the same effect as that obtained in the first embodiment. Namely, as shown by the enlarged drawing of the embedded drain region 17a and the channel region 11a in the semiconductor substrate 11, since the embedded drain region 17a does not contact the substrate surface in the channel region 11a, the isoelectric lines 20 are bent by the depletion layer expanded by drain potential and the control gate potential in the direction parallel to the substrate in the vicinity of the substrate surface. Driven by this curvature of the isoelectric lines, the carriers (electrons) running close to the substrate surface in the channel region 11a are placed in an electric field having an element perpendicular to the substrate. As a result, as shown in FIG. 11B, the electrons experience an external force having an upward element perpendicular to the substrate and the floating gate electrode 13 is located in the direction indicated by the arrow. Then the efficiency of electron injection to the floating gate electrode 13 is raised.

Further, the feature of this embodiment, namely, the stepped portion 11b which the floating gate electrode 13 strides, contributes to a further improvement in the writing speed.

The effect provided by the stepped portion 11b are explained below.

During the writing operation, the electric field directed to the source region 16 wraps around the corner of the lower stage of the stepped portion 11b, driven by the drain voltage applied to the drain region 17 formed on the lower stage of the stepped portion 11b. As a result, the electric field is unlikely to reach the vicinity of the standing wall of the stepped portion. Instead, it is likely to concentrate to the vicinity of the corner.

As described in the first embodiment, since the embedded drain region 17a does not reach the substrate surface, there appears a high electric field during the writing operation in the direction parallel to the substrate in the upper part of the embedded drain region 17a in the channel region 11a.

In other words, the electric field grows in the direction parallel to the substrate because the high electric field in the lower stage of the stepped portion 11b in the channel region 11a (hereafter, the lower stage channel region 11a) in the direction parallel to the substrate overlaps the concentration of electric field near the corner of the lower stage of the stepped portion 11b. In this way, a high electric field appears in a wide range from the corner of the lower stage of the stepped portion 11b to the lower stage channel region 11a. Thus the hot electron generation efficiency is raised.

In addition, when the stepped portion 11b is formed, a high electric field appears near the lower stage of the stepped portion 11b even if the drain voltage is low. Therefore, the drain voltage may be lowered.

It should be noted that the device according to the fourth embodiment as well may have the split-gate type gate electrode structure, instead of a so-called stacked gate type gate electrode structure where the gate dielectric film 12, floating gate electrode 13, capacitance dielectric film 14 and control gate electrode 15 are sequentially deposited on the semiconductor substrate 11. Namely, the fourth embodiment does not depend on the gate structure. However, the floating gate electrode 13 must be formed so as to have the stepped portion 11b.

The standing wall connecting the upper and lower stages of the stepped portion 11b does not need to be formed perpendicular to the substrate. For example, the standing wall may be curved and may not stand vertically on the lower stage.

The material for the semiconductor substrate 11 is not limited to a specific material; however, silicon (Si) is a preferable material. The SOI substrate may be used and its shape is not limited to a plate-like one. It may be any substrate including a semiconductor having a well where the source region 16 and the drain region 17 can be formed.

[First Variation of the Fourth Embodiment]

Figure 12A:
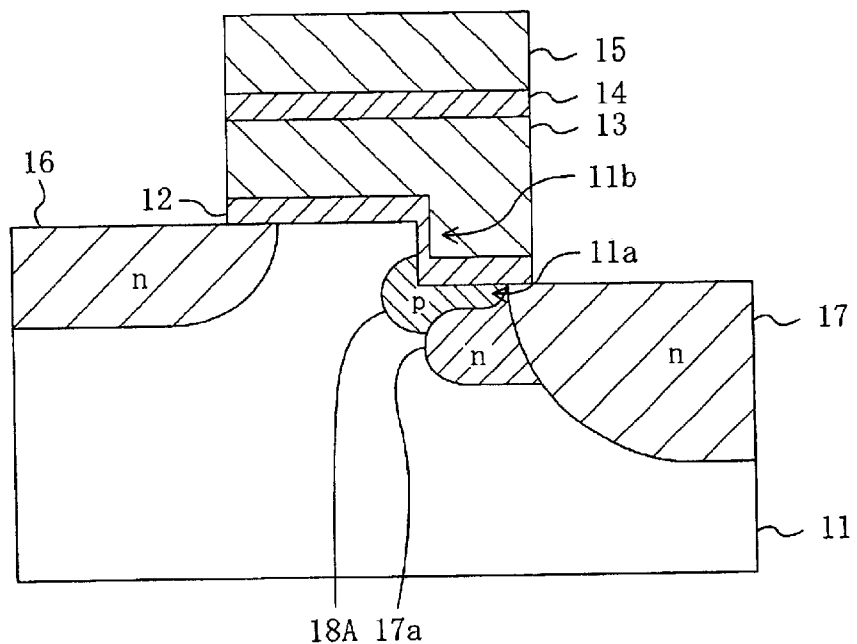
FIG. 12A is a sectional view of the nonvolatile semiconductor memory device according to a first variation of the fourth embodiment of the present invention.

FIG. 12A is a sectional view of the nonvolatile semiconductor memory device according to a first variation of the fourth embodiment of the present invention. In FIG. 12A, the same components as those in FIG. 11A have the same numerals and their explanation is not repeated.

As shown in FIG. 12A, this variation of the fourth embodiment features an embedded region adjacent upper area 18A having the conduction type opposite to that of the embedded drain region 17a. This embedded region adjacent upper area 18A is formed between the embedded drain region 17a and the surface of the lower stage of the stepped portion 11b in the semiconductor substrate 11.

The existence of the embedded region adjacent upper area 18A of which concentration of the p-type impurity is greater than that in the semiconductor substrate 11 enhances the electric field in the lower stage channel region 11a. Since the lower corner of the stepped portion 11b is covered with the embedded region adjacent upper area 18A, the impurity concentration around the corner becomes higher and the electric field appearing near the lower corner becomes stronger accordingly.

At the same time, the high electric field in the lower stage channel region 11a overlaps the high electric field in the lower corner in the stepped portion 11b. Then the efficiency of hot electron generation increases dramatically and thus the writing operation can be performed at higher speed. At this time, if a negative bias voltage is applied to the semiconductor substrate 11, the substrate potential falls and the potential difference between the lower stage channel region 11a and the floating gate electrode 13 grows. Then the channel electrons are electrically attracted with ease to the floating gate electrode 13 and the efficiency of electron injection to the floating gate electrode 13 is raised.

In addition, since the embedded region adjacent upper area 18A formed over the embedded drain region 17a includes the channel region 11a, it becomes possible to control the threshold voltage of the memory cell at a desired level by changing the impurity concentration in the embedded region adjacent upper area 18A.

[Second Variation of the Fourth Embodiment]

Figure 12B:
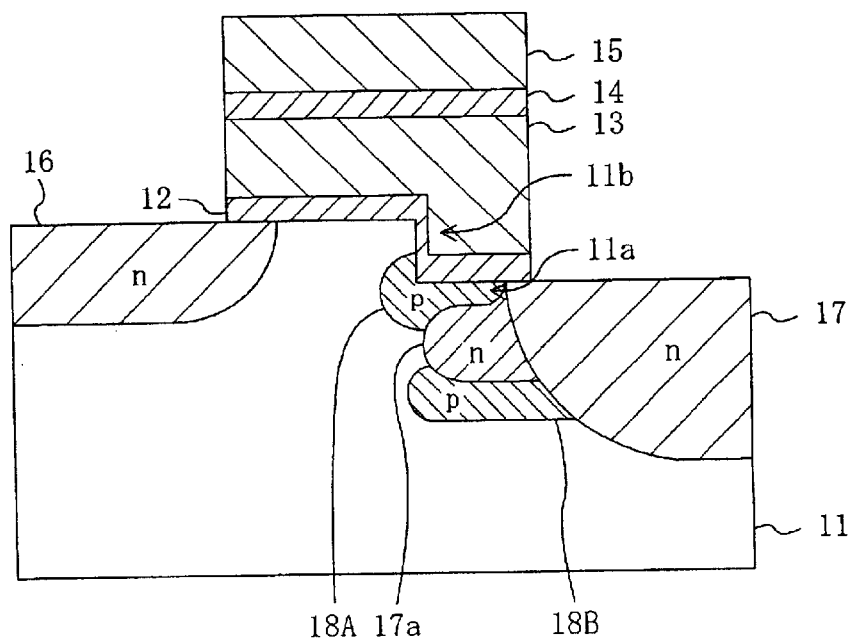
FIG. 12B is a sectional view of the nonvolatile semiconductor memory device according to a second variation of the fourth embodiment of the present invention.

FIG. 12B is a sectional view of the nonvolatile semiconductor memory device according to a second variation of the fourth embodiment of the present invention. In FIG. 12B, the same components as those in FIG. 11A have the same numerals and their explanation is not repeated.

As shown in FIG. 12B, in this variation of the fourth embodiment, an embedded region adjacent upper area 18A having the conduction type opposite to that of the embedded drain region 17a is formed between the embedded drain region 17a and the surface of the lower stage of the stepped portion 11b in the semiconductor substrate 11, while embedded region adjacent lower area 18B having the conduction type opposite to that of the embedded drain region 17a is formed under the embedded drain region 17a.

As is the case with the third embodiment, if the embedded region adjacent upper area 18A and the embedded region adjacent lower area 18B are formed to vertically sandwich the embedded drain region 17a, the potential difference due to the pn junction between the embedded region adjacent upper area 18A and the drain region 17 grows when the substrate is provided with a bias voltage. As a result, the hot electron generation efficiency is raised.

Further in the second variation, since the semiconductor substrate 11 has the stepped portion 11b which the floating gate electrode 13 strides, the electric field parallel to the substrate remarkably grows when a bias voltage is applied to the semiconductor substrate 11.

Figure 13:
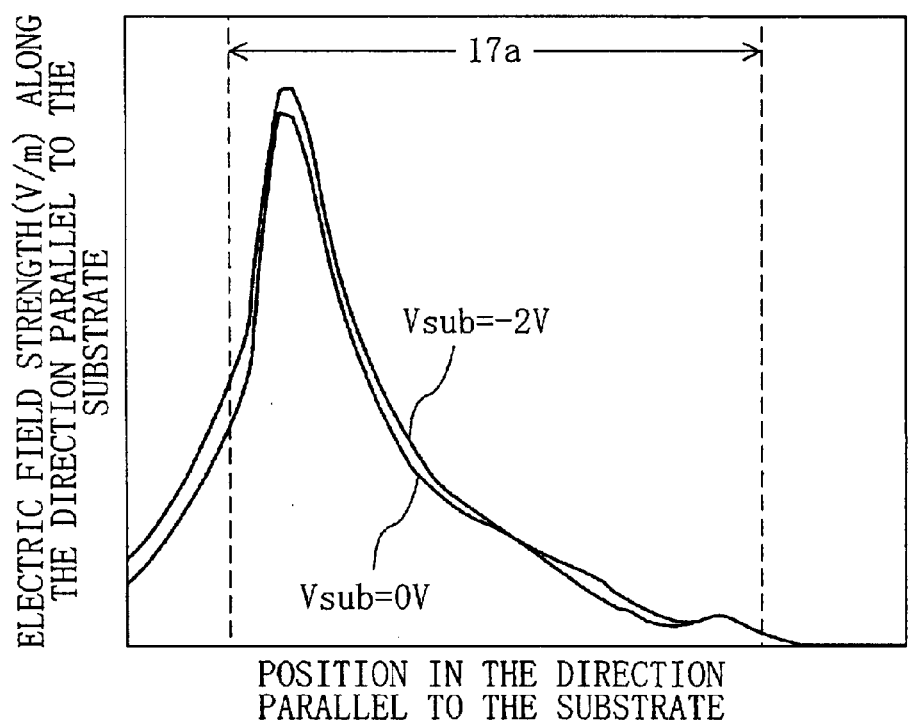
FIG. 13 is a graph illustrating the computer simulation of the strength of electric field created during writing operation in the direction parallel to the substrate in the channel region of the nonvolatile semiconductor memory device according to the second variation of the fourth embodiment of the present invention.

FIG. 13 is a graph illustrating the computer simulation of the strength of electric field created during writing operation in the direction parallel to the substrate in the lower stage channel region 11a, while the range denoted 17a indicates the upper region corresponding to the embedded drain region 17a. In the graph, two case studies are shown where −2V and 0V (ground voltage) are applied to the substrate as the substrate bias voltage Vsub. As shown FIG. 13, in the structure where the embedded region adjacent upper area 18A is formed over the embedded drain region 17a and the embedded region adjacent lower area 18B is formed under the embedded drain region 17a, when a negative bias is applied to the substrate, the electric field created over the embedded drain region 17a in the channel region 11a in the direction parallel to the substrate becomes strong over a range wider than that provided when the ground potential is applied. In this way, if the substrate has the stepped portion 11b, the effect of bias voltage is enhanced, because the electrical coupling between the embedded region adjacent upper area 18A and the semiconductor substrate 11 becomes strong. As a result, the hot electron generation efficiency in the lower stage channel region 11a is raised and then the speed of writing operation is raised as well.

[First Manufacturing Method of the Fourth Embodiment]

A first manufacturing method of the nonvolatile semiconductor memory device according to the second variation of the fourth embodiment is explained below with reference to the attached drawings.

FIGS. 14A–14D and FIGS. 15A–15C are sectional views of the respective steps in the first manufacturing process for the nonvolatile semiconductor memory device according to the second variation of the fourth embodiment of the present invention.

Figure 14A:
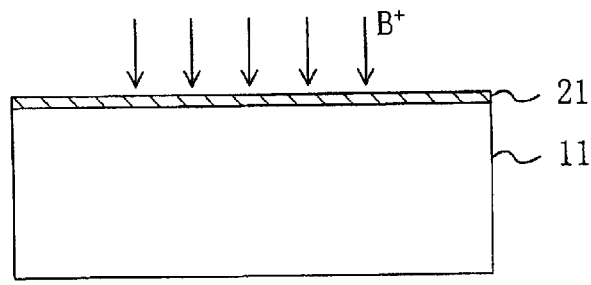
FIGS. 14A–14D are sectional views of the respective steps in a first manufacturing process for the nonvolatile semiconductor memory device according to the second variation of the fourth embodiment of the present invention.

First, referring to FIG. 14A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage, at an injection energy of about 30 keV and a doze of $5.0\times10^{12}/cm^2$–$1.0\times10^{13}/cm^2$.

Figure 14B:
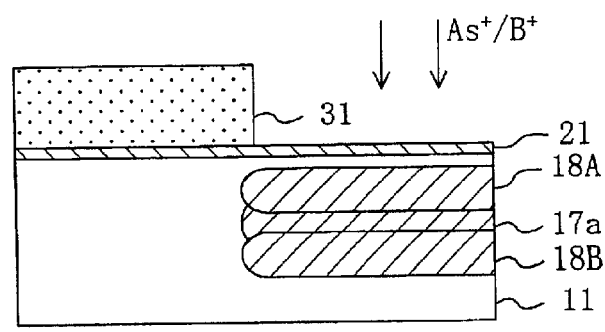

Next as shown in FIG. 14B, a resist mask pattern 31 having an opening for exposing the drain formation region is formed on the semiconductor substrate 11 by the photolithography method. Subsequently, with the fabricated mask pattern 31 being used, arsenic (As) ions serving as an n-type impurity are injected into the semiconductor substrate 11, at an injection energy of about 20 keV-50 keV and a dose of about $1.0\times10^{13}/cm^2$–$1.0\times10^{14}/cm^2$. In this way, the embedded drain region 17a is formed in a deep area so that its top is located at a distance from the surface of the semiconductor substrate 11.

Subsequently, with the fabricated mask pattern 31 being used, boron (B) ions serving as a p-type impurity are injected into the semiconductor substrate 11, at an injection energy of about 10 keV-30 keV and a dose of about $1.0\times10^{12}/cm^2$–$1.0\times10^{13}/cm^2$. In this way, the embedded region adjacent upper area 18A is formed over the embedded drain region 17a. Subsequently, with the fabricated mask pattern 31 being used, boron (B) ions are injected at an injection energy higher than that adopted in forming the embedded region adjacent upper area 18A, namely, about 30 keV-50 keV and a dose of about $1.0\times10^{12}/cm^2$–$1.0\times10^{13}/cm^2$. In this way, the embedded region adjacent lower area 18B is formed so that its top is located under the embedded drain region 17a.

Figure 14C:
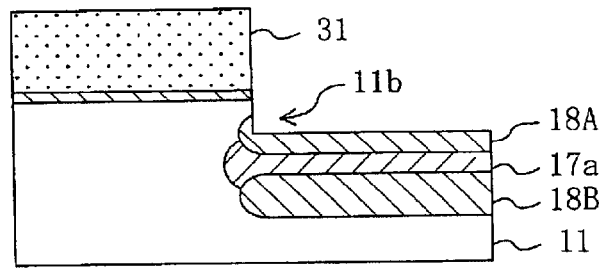

Next, as shown in FIG. 14C, with the mask pattern 31 being used, a stepped portion 11b is formed in the upper part of the semiconductor substrate 11 by conducting an etching of about 50 nm-deep, for example, on the protective oxide film 21 and the semiconductor substrate 11, so that the embedded region adjacent upper area 18A is exposed to surface.

Figure 14D:
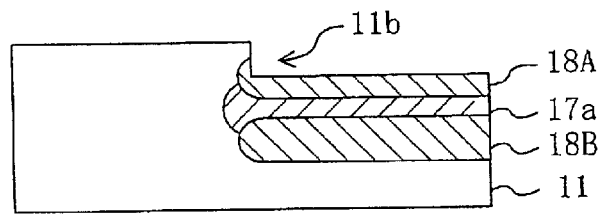
Figure 15A:
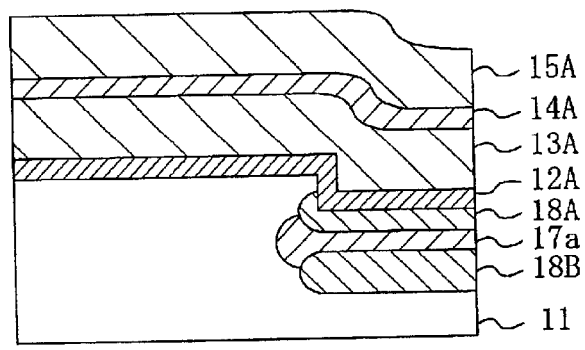
FIGS. 15A–15C are sectional views of the respective steps in the first manufacturing process for the nonvolatile semiconductor memory device according to the second variation of the fourth embodiment of the present invention.

Next, as shown in FIG. 14D, after the mask pattern 31 and the protective oxide film 21 have been removed, the gate dielectric formation film 12A made of an about 11 nm-thick silicon oxide film is formed by the thermal oxidation method or the like, as shown in FIG. 15A, over the whole main surface of the semiconductor substrate 11 including the wall of the stepped portion 11b. Subsequently, the first gate electrode formation film 13A which is about 0.1 $\mu$m in thickness and made of poly-silicon is deposited on the whole surface of the gate dielectric formation film 12A including the stepped portion 11b by the low-pressure CVD method or the like. In addition, the capacitance dielectric formation film 14A which is about 13 nm thick and made of silicon oxide or silicon nitride or the like is formed on the first gate electrode formation film 13A; and on the formed capacitance dielectric formation film 14A the second gate electrode formation film 15A which is about 0.1 $\mu$m thick and made of poly-silicon is deposited.

Figure 15B:
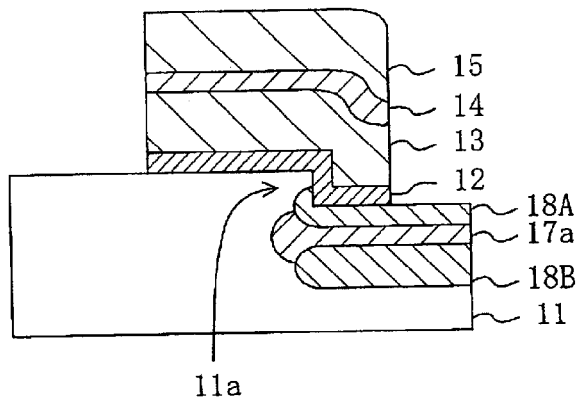

Next, as shown in FIG. 15B, the second gate electrode formation film 15A, capacitance dielectric formation film 14A, first gate electrode formation film 13A and gate dielectric formation film 12A are selectively etched for patterning to form the control gate electrode 15 from the second gate electrode formation film 15A, the capacitance dielectric film 14 from the capacitance dielectric formation film 14A, the floating gate electrode 13 from the first gate electrode formation film 13A and the gate dielectric film 12 from the gate dielectric formation film 12A. At this time, the floating gate electrode 13 and the control gate electrode 15 are formed astride the stepped portion 11b.

Figure 15C:
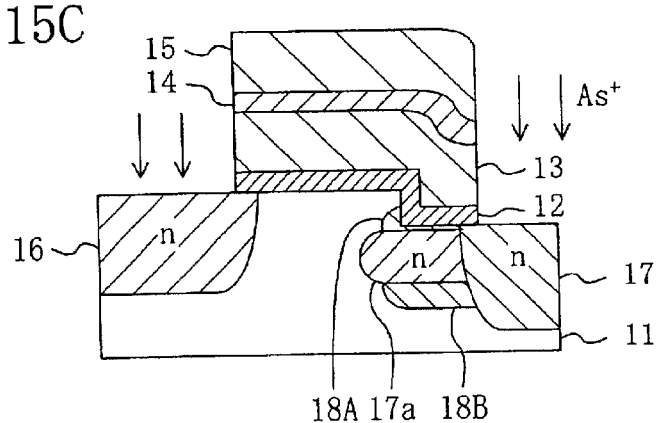

Subsequently, as shown in FIG. 15C, with the control gate electrode 15 and the floating gate electrode 13 at least being used as masks, the source region 16 is formed in the source foramtion region in the semiconductor substrate 11, by injecting arsenic (As) ions at an injection energy of about 50 keV and a dose of about $3.0\times10^{15}/cm^2$ in the semiconductor substrate 11; and then the drain region 17 is formed in the drain formation region so as to be connected to the embedded drain region 17a under the floating gate electrode 13.

In this way, according to the first manufacturing method of the fourth embodiment of the invention, the embedded drain region 17a that has a predetermined impurity profile and is connected to the drain region 17 is formed under the floating gate electrode 13 in the semiconductor substrate 11. In addition, the embedded region adjacent upper area 18A can be formed over the embedded drain region 17a, and the embedded region adjacent lower area 18B is formed under the embedded drain region 17a.

In the first manufacturing method, the fabrication sequence for the embedded area neighboring region 18A, the embedded region adjacent lower area 18B and the embedded drain region 17a is not fixed.

It is not always necessary to form the embedded region adjacent upper area 18A or embedded region adjacent lower area 18B. Only either of them may be formed. For example, if either embedded region adjacent upper area 18A or embedded region adjacent lower area 18B is not formed, the nonvolatile semiconductor memory device according to the fourth embodiment is manufactured. Meanwhile, if only the embedded region adjacent upper area 18A is formed, the nonvolatile semiconductor memory device according to the first variation of the fourth embodiment is manufactured.

Besides, the conduction type of the embedded drain region 17a may be a p-type of an impurity concentration lower than those in embedded region adjacent upper area 18A and embedded region adjacent lower area 18B.

[Second Manufacturing Method of the Fourth Embodiment]

A second manufacturing method of the nonvolatile semiconductor memory device according to the second variation of the fourth embodiment is explained below with reference to the attached drawings.

FIGS. 16A–16D and FIGS. 17A–17D are sectional views of the respective steps in the second manufacturing process for the nonvolatile semiconductor memory device according to the second variation of the fourth embodiment of the present invention.

Figure 16A:
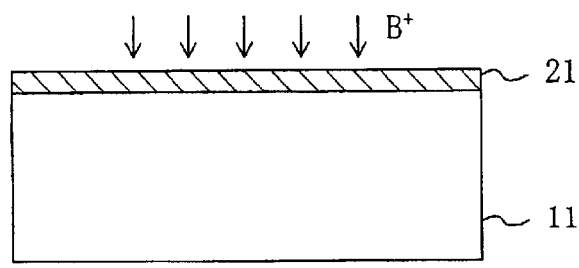
FIGS. 16A–16D are sectional views of the respective steps in a second manufacturing process for the nonvolatile semiconductor memory device according to the second variation of the fourth embodiment of the present invention.

First, referring to FIG. 16A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage, at an injection energy of about 30 keV and a doze of $5.0 \times 10^{12}/cm^2 - 1.0 \times 10^{13}/cm^2$.

Figure 16B:
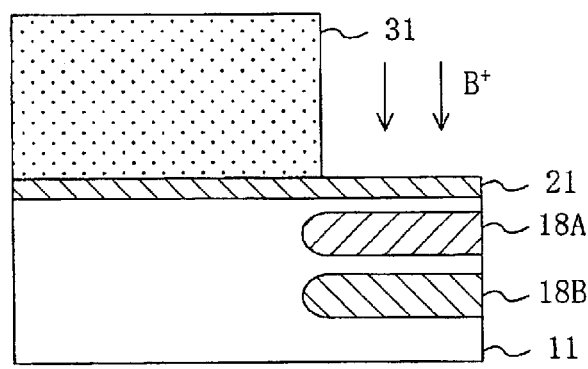

Next as shown in FIG. 16B, a resist mask pattern 31 having an opening for exposing the drain foramtion region is formed by the photolithography method on the semiconductor substrate 11. Subsequently, with the fabricated mask pattern 31 being used, boron (B) ions serving as a p-type impurity are injected into the semiconductor substrate 11, at an injection energy of about 10 keV-30 keV and a dose of about $1.0 \times 10^{12}/cm^2 - 1.0 \times 10^{13}/cm^2$. In this way, the embedded region adjacent upper area 18A is formed in a shallow position in the semiconductor substrate 11. Subsequently, with the fabricated mask pattern 31 being used, boron (B) ions are injected at an injection energy higher than that adopted in forming the embedded region adjacent upper area 18A, namely, about 30 keV-50 keV and a dose of about $1.0 \times 10^{12}/cm^2 - 1.0 \times 10^{13}/cm^2$. In this way, the embedded region adjacent lower area 18B is formed so that its top is located in the bottom of or under the region to be formed as the embedded drain region. Either embedded region adjacent upper area 18A or embedded region adjacent lower area 18B may be formed first.

Figure 16C:
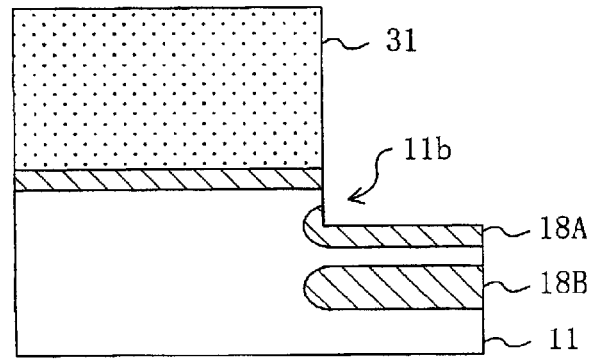

Next, as shown in FIG. 16C, with the mask pattern 31 being used, the stepped portion 11b is formed in the upper part of the semiconductor substrate 11 by conducting an etching of about 50 nm-deep, for example, on the protective oxide film 21 and the semiconductor substrate 11, so that the embedded region adjacent upper area 18A is exposed to surface.

Figure 16D:
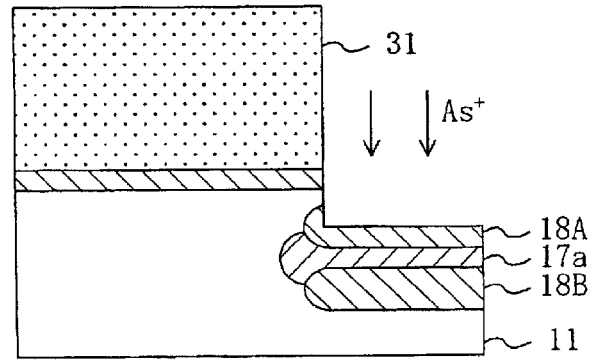

Subsequently, as shown in FIG. 16D, with the fabricated mask pattern 31 being used, arsenic (As) ions serving as an n-type impurity are injected into the semiconductor substrate 11, at an injection energy of about 20 keV-50 keV and a dose of about $1.0 \times 10^{13}/cm^2 - 1.0 \times 10^{14}/cm^2$. In this way, the embedded drain region 17a is formed between the embedded region adjacent upper area 18A and the embedded region adjacent lower area 18B.

Figure 17A:
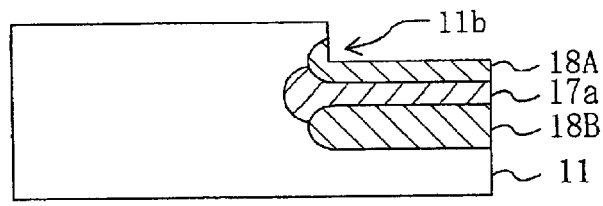
FIGS. 17A–17D are sectional views of the respective steps in the second manufacturing process for the nonvolatile semiconductor memory device according to the second variation of the fourth embodiment of the present invention.
Figure 17B:
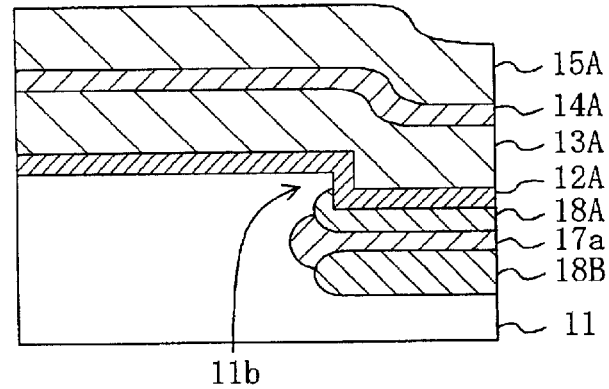

Next, as shown in FIG. 17A, after the mask pattern 31 and the protective oxide film 21 have been removed, the gate dielectric formation film 12A made of an about 11 nm-thick silicon oxide film is formed by the thermal oxidation method or the like, as shown in FIG. 17B, over the whole main surface of the semiconductor substrate 11 including the wall of the stepped portion 11b. Subsequently, the first gate electrode formation film 13A which is about 0.1 μm in thickness and made of poly-silicon is deposited on the whole surface of the gate dielectric formation film 12A including the stepped portion 11b by the low-pressure CVD method or the like. In addition, the capacitance dielectric formation film 14A which is about 13 nm thick and made of silicon oxide or silicon nitride or the like is formed on the first gate electrode formation film 13A; and on the formed capacitance dielectric formation film 14A the second gate electrode formation film 15A which is about 0.1 μm thick and made of poly-silicon is deposited.

Figure 17C:
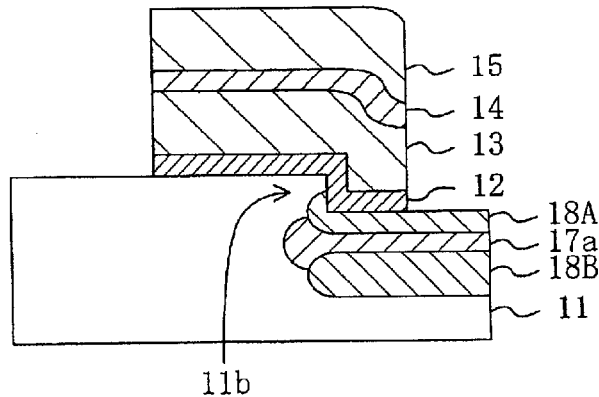

Next, as shown in FIG. 17C, the second gate electrode formation film 15A, capacitance dielectric formation film 14A, first gate electrode formation film 13A and gate dielectric formation film 12A are selectively etched for patterning to form the control gate electrode 15 from the second gate electrode formation film 15A, the capacitance dielectric film 14 from the capacitance dielectric formation film 14A, the floating gate electrode 13 from the first gate electrode formation film 13A and the gate dielectric film 12 from the gate dielectric formation film 12A. At this time, the floating gate electrode 13 and the control gate electrode 15 are formed astride the stepped portion 11b.

Figure 17D:
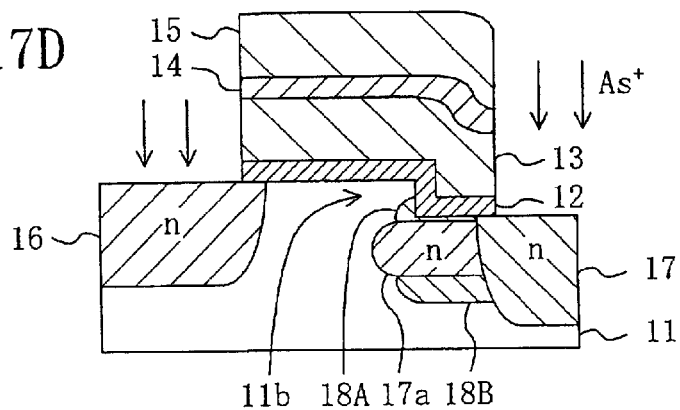

Subsequently, as shown in FIG. 17D, with the control gate electrode 15 and the floating gate electrode 13 at least being used as masks, the source region 16 is formed in the source formation region in the semiconductor substrate 11, by injecting arsenic (As) ions at an injection energy of about 50 keV and a dose of about $3.0 \times 10^{15}/cm^2$ in the semiconductor substrate 11; and then the drain region 17 is formed in the drain formation region so as to be connected to the embedded drain region 17a under the floating gate electrode 13.

In this way, according to the second manufacturing method of the fourth embodiment of the invention, the embedded drain region 17a that has a predetermined impurity profile and is connected to the drain region 17 is formed under the floating gate electrode 13 in the semiconductor substrate 11. In addition, the embedded region adjacent upper area 18A can be formed over the embedded drain region 17a, and the embedded region adjacent lower area 18B is formed under the embedded drain region 17a.

In the second manufacturing method, the embedded region adjacent upper area 18A and the embedded region adjacent lower area 18B were formed before the stepped portion 11b was formed; and the embedded drain region 17a was formed after the stepped portion 11b was formed. However, this process sequence is not fixed. Namely, the embedded drain region 17a may be formed before the fabrication of the stepped portion 11b, and the embedded region adjacent upper area 18A and the embedded region adjacent lower area 18B may be formed after the fabrication of the stepped portion 11b. Both embedded region adjacent upper area 18A and embedded region adjacent lower area 18B are not necessarily formed, but only either of them may be formed.

Besides, the conduction type of the embedded drain region 17a may be a p-type of an impurity concentration lower than those in the embedded region adjacent upper area 18A and embedded region adjacent lower area 18B.

[Third Manufacturing Method of the Fourth Embodiment]

A third manufacturing method of the nonvolatile semiconductor memory device according to the second variation of the fourth embodiment is explained below with reference to the attached drawings.

FIGS. 18A–18D and FIGS. 19A–19C are sectional views of the respective steps in the third manufacturing process for the nonvolatile semiconductor memory device according to the second variation of the fourth embodiment of the present invention.

Figure 18A:
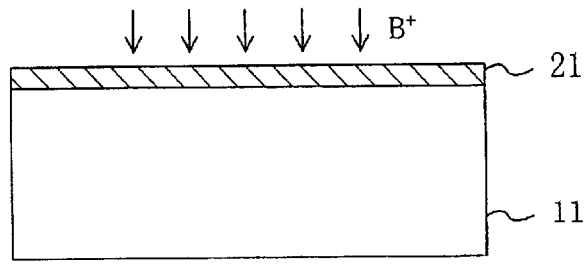
FIGS. 18A–18D are sectional views of the respective steps in a third manufacturing process for the nonvolatile semiconductor memory device according to the second variation of the fourth embodiment of the present invention.

First, referring to FIG. 18A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage, at an injection energy of about 30 keV and a doze of $5.0 \times 10^{12}/cm^2 - 1.0 \times 10^{13}/cm^2$.

Figure 18B:
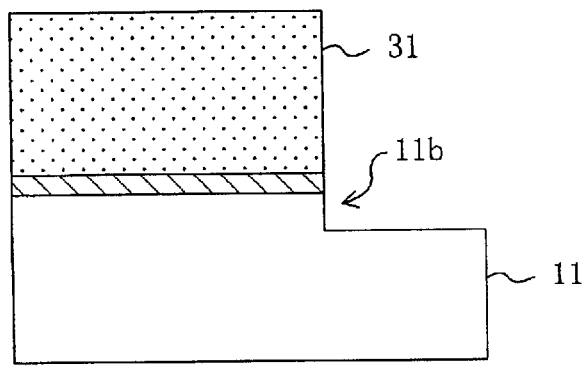

Next as shown in FIG. 18B, a resist mask pattern 31 having an opening for exposing the drain formation region is formed on the semiconductor substrate 11 by the photolithography method. Subsequently with the mask pattern 31 being used, a stepped portion 11b is formed in the upper part of the semiconductor substrate 11 by conducting an etching of about 50 nm-deep, for example, on the protective oxide film 21 and the semiconductor substrate 11.

Figure 18C:
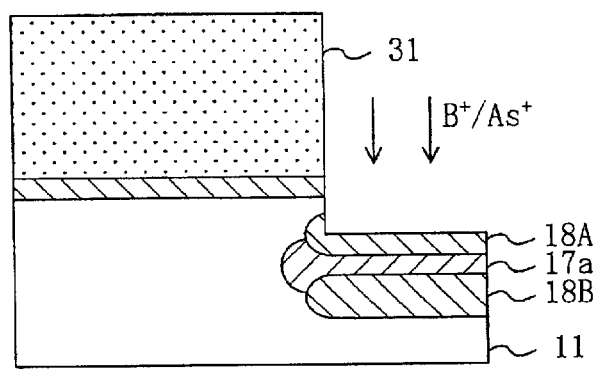

As shown in FIG. 18C, with the mask pattern 31 being used, boron (B) ions serving as a p-type impurity are injected into the semiconductor substrate 11, at an injection energy of about 10 keV-30 keV and a dose of about $1.0 \times 10^{12}/cm^2 - 1.0 \times 10^{13}/cm^2$. In this way, the embedded region adjacent upper area 18A is formed in a shallow location in the semiconductor substrate 11. Subsequently, with the fabricated mask pattern 31 being used, boron (B) ions are injected at an injection energy higher than that adopted in forming the embedded region adjacent upper area 18A, namely, about 30 keV-50 keV and a dose of about $1.0 \times 10^{12}/cm^2 - 1.0 \times 10^{13}/cm^2$. In this way, the embedded region adjacent lower area 18B is formed so that its top is located in the bottom of or under the region to be formed as the embedded drain region.

Next, with the mask pattern 31 being used, arsenic (As) ions serving as an n-type impurity are injected into the semiconductor substrate 11, at an injection energy of about 20 keV-50 keV and a dose of about $1.0 \times 10^{13}/cm^2 - 1.0 \times 10^{14}/cm^2$. In this way, the embedded drain region 17a is formed between the embedded region adjacent upper area 18A and the embedded region adjacent lower area 18B.

Figure 18D:
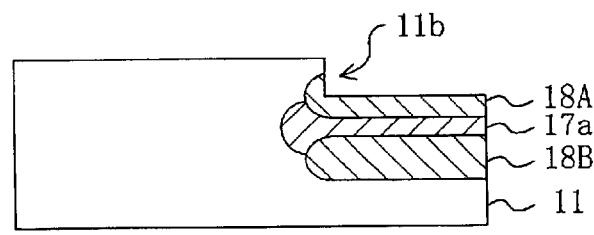
Figure 19A:
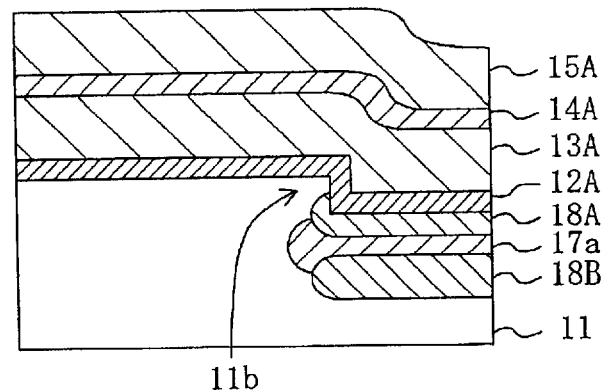
FIGS. 19A–19C are sectional views of the respective steps in the third manufacturing process for the nonvolatile semiconductor memory device according to the second variation of the fourth embodiment of the present invention.

Next, as shown in FIG. 18D, after the mask pattern 31 and the protective oxide film 21 have been removed, the gate dielectric formation film 12A made of an about 11 nm-thick silicon oxide film is formed by the thermal oxidation method or the like, as shown in FIG. 19A, over the whole main surface of the semiconductor substrate 11 including the wall of the stepped portion 11b. Subsequently, the first gate electrode formation film 13A which is about 0.1 $\mu$m in thickness and made of poly-silicon is deposited on the whole surface of the gate dielectric formation film 12A including the stepped portion 11b by the low-pressure CVD method or the like. In addition, the capacitance dielectric formation film 14A which is about 13 nm thick and made of silicon oxide or silicon nitride or the like is formed on the first gate electrode formation film 13A; and on the formed capacitance dielectric formation film 14A the second gate electrode formation film 15A which is about 0.1 $\mu$m thick and made of poly-silicon is deposited.

Figure 19B:
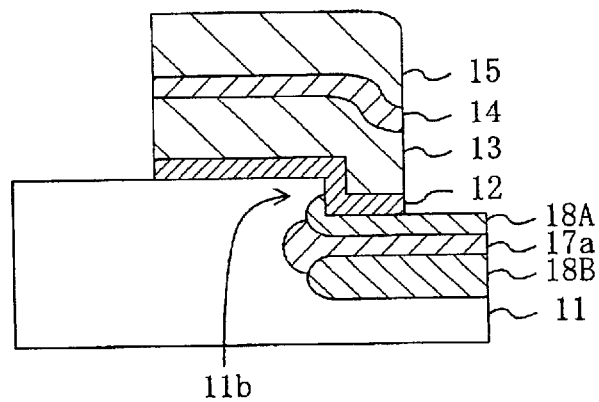

Next, as shown in FIG. 19B, the second gate electrode formation film 15A, capacitance dielectric formation film 14A, first gate electrode formation film 13A and gate dielectric formation film 12A are selectively etched for patterning to form the control gate electrode 15 from the second gate electrode formation film 15A, the capacitance dielectric film 14 from the capacitance dielectric formation film 14A, the floating gate electrode 13 from the first gate electrode formation film 13A and the gate dielectric film 12 from the gate dielectric formation film 12A. At this time, the floating gate electrode 13 and the control gate electrode 15 are formed astride the stepped portion 11b.

Figure 19C:
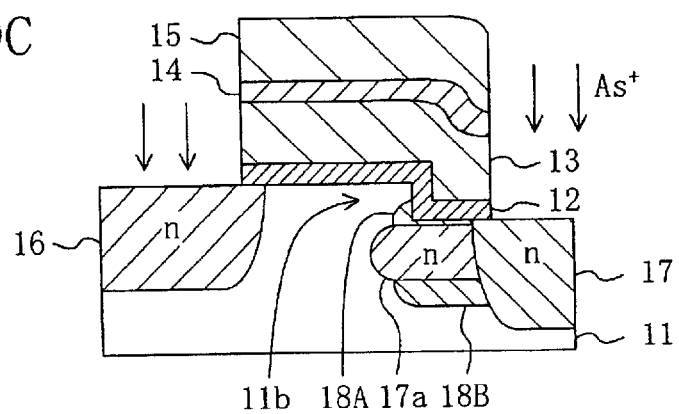

Subsequently, as shown in FIG. 19C, with the control gate electrode 15 and the floating gate electrode 13 at least being used as masks, the source region 16 is formed in the source foramtion region in the semiconductor substrate 11, by injecting arsenic (As) ions at an injection energy of about 50 keV and a dose of about $3.0 \times 10^{15}/cm^2$ in the semiconductor substrate 11; and then the drain region 17 is formed in the drain formation region so as to be connected to the embedded drain region 17a under the floating gate electrode 13.

In this way, according to the third manufacturing method of the fourth embodiment of the invention, the embedded drain region 17a that has a predetermined impurity profile and is connected to the drain region 17 is formed under the floating gate electrode 13 in the semiconductor substrate 11. In addition, the embedded region adjacent upper area 18A can be formed over the embedded drain region 17a, and the embedded region adjacent lower area 18B is formed under the embedded drain region 17a.

In the third manufacturing method, the embedded region adjacent upper area 18A embedded region adjacent lower area 18B and embedded drain region 17a may be formed in any desired order.

Both embedded region adjacent upper area 18A and embedded region adjacent lower area 18B are not necessarily formed, but only either of them may be formed.

Besides, the conduction type of the embedded drain region 17a may be a p-type of an impurity concentration lower than those in the embedded region adjacent upper area 18A and embedded region adjacent lower area 18B.

[Fifth Embodiment]

Now referring to the attached drawings, a fifth embodiment of the present invention is described below.

Figure 20A:
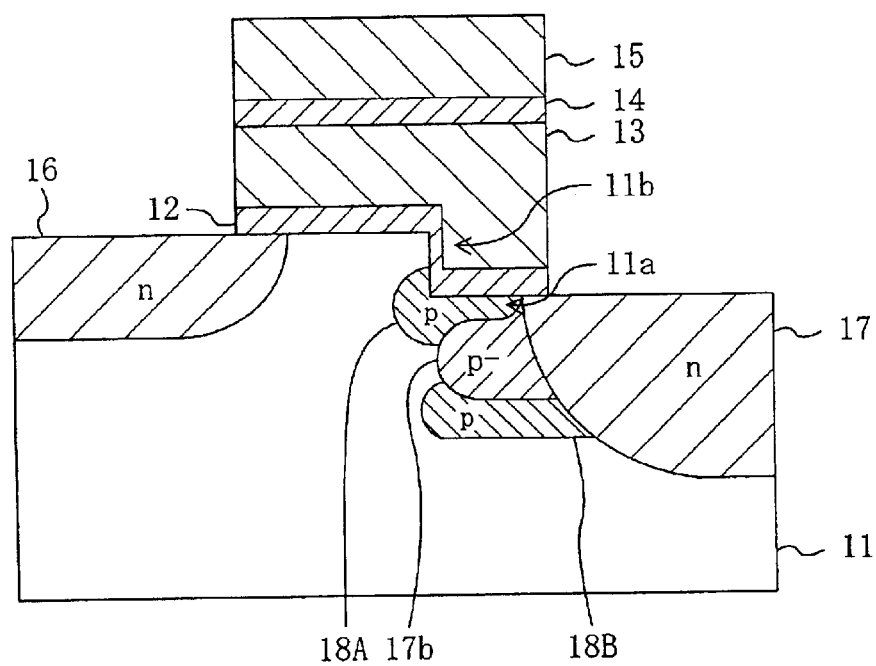
FIGS. 20A and 20B are schematic diagrams illustrating a nonvolatile semiconductor memory device according to a fifth embodiment of the present invention.

FIG. 20A is a sectional view of the nonvolatile semiconductor memory device according to the fifth embodiment of the present invention, specifically, the sectional structure of an n-type channel flash EEPROM. In FIG. 20A, the same components as those in FIG. 12B have the same numerals and their explanation is not repeated.

As shown in FIG. 20A, the nonvolatile semiconductor memory device according to the fifth embodiment has a p-type embedded drain 17b having the p-type conduction type of which impurity concentration is lower than those in the embedded region adjacent upper area 18A and the embedded region adjacent lower area 18B. It should be noted that the impurity concentration in the p-type embedded drain region 17b is set at a level that can make the region depleted during writing operation.

Figure 20B:
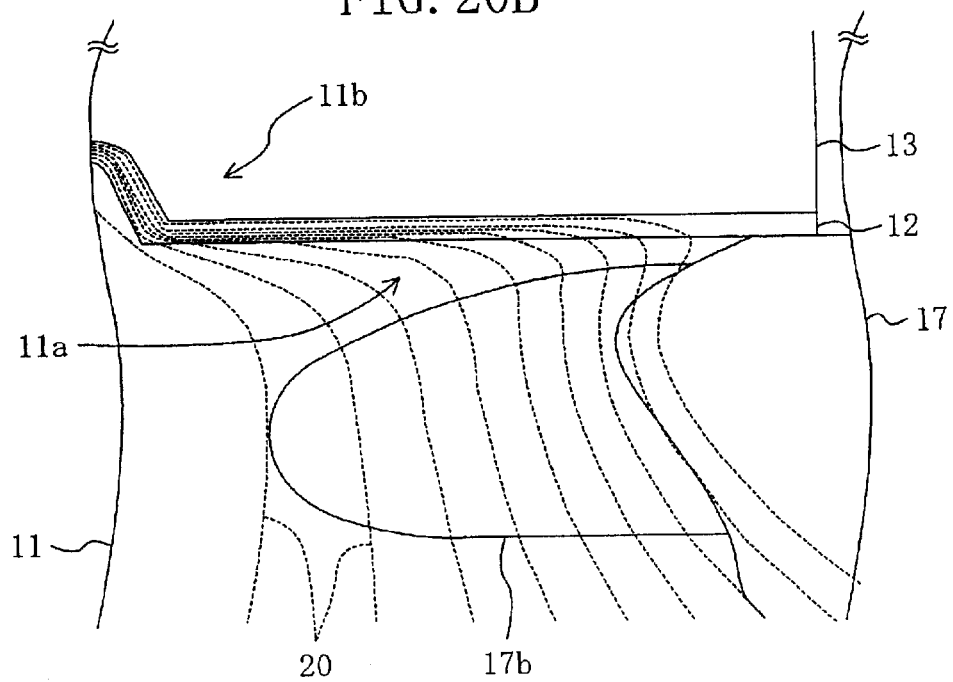

FIG. 20B is a graph showing the isoelectric distribution near the p-type embedded drain region 17b predicted by the two-dimensional numerical analysis of the nonvolatile semiconductor memory device according to the fifth embodiment. Referring to FIG. 20B, a channel region 11a is formed close to the substrate surface above the p-type embedded drain region 17b. The isoelectric lines 20 bend in the direction parallel to the substrate in the channel region 11a. Therefore, as explained in the first embodiment, the electrons there experience an external force of the electric field having an element perpendicular to the substrate and then the efficiency of electrons injected to the floating gate electrode 13 is improved.

The p-type embedded drain 17b is depleted by the drain voltage during writing operation. As a result of this depletion, a potential drops from the drain region 17 toward the source region 16 in the lower channel region 11a, and then an electric field appears in the direction parallel to the substrate in the channel region 11a.

In this way, even if the n-type embedded drain region 17a is not formed, the location of high electric field moves toward the source region 16 in the channel region 11a. Then since the high electric field appears directly under the floating gate electrode 13, the efficiency of electrons injected to the floating gate electrode 13 is improved.

Besides, in combination with the concentration of electric field created by the stepped portion 11b formed under the floating gate electrode 13 in the semiconductor substrate 11, a high electric field appears from the lower corner of the stepped portion 11b to the whole range in the lower channel region 11a.

As described above, even when the embedded drain region 17a is a p-type region, the writing operation can be driven at high speed and at low voltage. In the fifth embodiment, however, the magnitude of readout current becomes smaller than that provided when the embedded drain region 17a is an n-type region.

The standing wall connecting the upper and lower stages of the stepped portion 11b does not need to be perpendicular to the substrate. For example, the standing wall may be curved and may not stand vertically on the lower stage.

The material for the semiconductor substrate 11 is not limited to a specific material; however, silicon (Si) is a preferable material. The SOI substrate may be used and its shape is not limited to a plate-like one. It may be any substrate including a semiconductor having a well where the source region 16 and the drain region 17 can be formed.

When the p-type embedded drain 17b is formed, boron(B) ions, for example, may be injected at the injection energy of about 15–40 keV and the dose amount of around $1\times10^{12}/\text{cm}^2 - 5\times10^{12}/\text{cm}^2$. Further, the boron injection for forming this p-type embedded drain region 17b can be omitted.

The effective p-type impurity concentration in the p-type embedded drain region 17b can be controlled by injecting n-type impurity ions, for example, arsenic (As) ions at a low dose level, in the region that will be the p-type embedded drain region 17b.

Although the electric field becomes slightly lower in the lower channel region 11a, the semiconductor substrate 11 may not have the stepped portion 11b.

[Sixth Embodiment]

Now referring to the attached drawings, a sixth embodiment of the present invention is described below.

Figure 21:
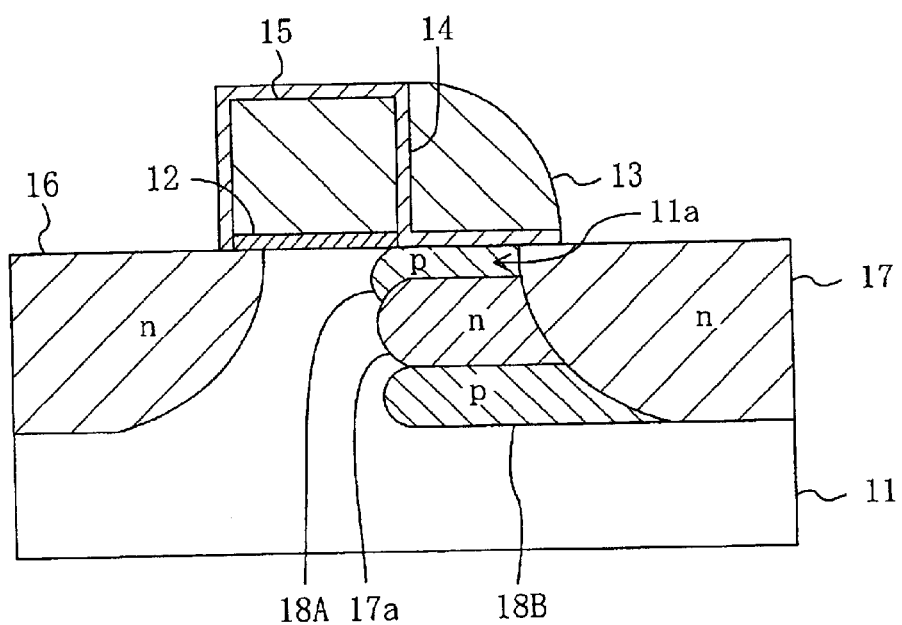
FIG. 21 is a sectional view of a nonvolatile semiconductor memory device according to a sixth embodiment of the present invention.

FIG. 21 is a sectional view of the nonvolatile semiconductor memory device according to the sixth embodiment of the present invention, specifically, the sectional structure of an n-type channel flash EEPROM. In FIG. 21, the same components as those in FIG. 1A are denoted with the same numerals.

Referring now to FIG. 21, the nonvolatile semiconductor memory device according to the sixth embodiment has the so-called split-gate type gate structure in which a control gate electrode 15 is formed via a gate dielectric film 12 on the semiconductor substrate 11 and a floating gate electrode 13 is formed on the side of the control gate electrode 15 via the capacitance dielectric film 14 serving as a second dielectric film. The capacitance dielectric film 14 works as a tunnel dielectric film serving as a first dielectric film in the region where the floating gate electrode 13 is faced with the main surface of the semiconductor substrate 11.

Under the floating gate electrode 13 in the semiconductor substrate 11, the end of the n-type drain region 17, on the side faced with the n-type source region 16, extends toward the source region 16 without reaching the surface of the semiconductor substrate 11 to form an n-type embedded drain region 17a. In addition, above the embedded drain region 17a, a p-type embedded region adjacent upper area 18A is formed, while under the embedded drain region 17a a p-type embedded region adjacent lower area 18B is formed.

The impurity concentration in the embedded drain region 17a is set at a value smaller than that in the drain region 17, while those in the embedded region adjacent upper area 18A and embedded region adjacent lower area 18B are set larger than the p-type impurity concentration in the semiconductor substrate 11.

This split-gate type nonvolatile semiconductor memory device having the control gate electrode 15 and the neighboring floating gate electrode 13 on the semiconductor substrate 11 has the embedded drain region 17a under the floating gate electrode 13 in the semiconductor substrate 11. Therefore, the channel region 11a formed near the surface over the embedded drain region 17a in the semiconductor substrate 11 features: (1) the isoelectric lines curve in the direction along the substrate; (2) potential drops from the drain side 17 toward the source side 16; and (3) the peak in the high electric field moves toward the source side in the channel region 11a. As a result, it becomes possible to raise the hot carrier generation efficiency and the efficiency of carrier injection to the floating gate electrode 13 during writing operation.

The material for the semiconductor substrate 11 is not limited to a specific material; however, silicon (Si) is a preferable material. The SOI substrate may be used and its shape is not limited to a plate-like one. It may be any substrate including a semiconductor having a well where the source region 16 and the drain region 17 can be formed.

Now explained below is the manufacturing method of the nonvolatile semiconductor memory device according to the sixth embodiment of the invention.

FIGS. 22A–22D are sectional views of the respective steps in the manufacturing process for the nonvolatile semiconductor memory device according to the sixth embodiment of the present invention.

Figure 22A:
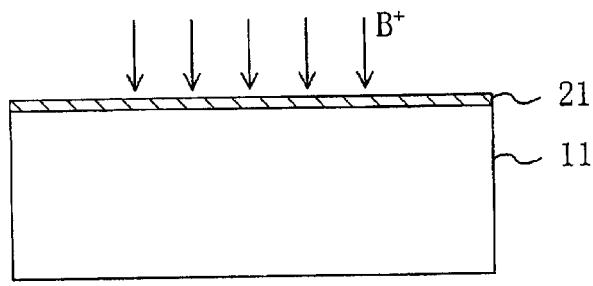
FIGS. 22A–22D are sectional views of the respective steps in a manufacturing process for the nonvolatile semiconductor memory device according to the sixth embodiment of the present invention.

First as shown in FIG. 22A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage.

Figure 22B:
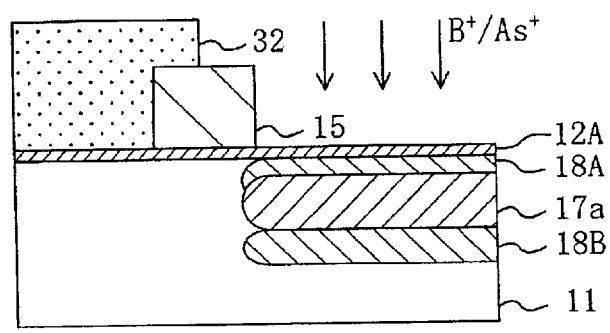

Next as shown in FIG. 22B, after the protective oxide film 21 has been removed, the gate dielectric formation film 12A made of about 13 nm-thick silicon oxide is formed by the thermal oxidation method or the like on the main surface of the semiconductor substrate 11. Subsequently, a poly-silicon film of about 0.2 μm in thickness is deposited on the gate dielectric formation film 12A by the low pressure CVD method, for example, and this deposited poly-silicon film is patterned by the photolithography and etching method to form the control gate electrode 15 serving as a second gate electrode.

Subsequently, a resist mask pattern 32 having an opening for exposing the drain formation region is formed on the semiconductor substrate 11. At this time, the mask pattern 32 is formed so that its end facing the drain side is located on the control gate electrode 15 to use the drain side of the gate electrode 15 as a mask. Subsequently, with the fabricated mask pattern 32 and the control gate electrode 15 being used as masks, boron (B) ions serving as a p-type impurity are injected into the semiconductor substrate 11, at an injection energy of about 10 keV-30 keV and a dose of about $1.0\times10^{12}/\text{cm}^2 - 1.0\times10^{13}/\text{cm}^2$. In this way, the embedded region adjacent upper area 18A is formed in a shallow position in the semiconductor substrate 11. Further, boron (B) ions are injected at an injection energy higher than that adopted in forming the embedded region adjacent upper area 18A, namely, about 30 keV-50 keV and a dose of about $1.0\times10^{12}/\text{cm}^2 - 1.0\times10^{13}/\text{cm}^2$. In this way, the embedded region adjacent lower area 18B is formed so that its top is located in the bottom of or under the region to be formed as the embedded drain region.

Next, with the fabricated mask pattern 32 and the control gate electrode 15 being used as masks, arsenic (As) ions serving as an n-type impurity are injected into the semiconductor substrate 11, at an injection energy of about 20 keV–50 keV and a dose of about $1.0\times10^{13}/\text{cm}^2 - 1.0\times10^{14}/\text{cm}^2$. In this way, the embedded drain region 17a is formed between the embedded region adjacent upper area 18A and the embedded region adjacent lower area 18B.

In the sixth embodiment, the ion injection into the embedded region adjacent upper area 18A, embedded region adjacent lower area 18B and embedded drain region 17a was performed in a self-consistent manner, with the control gate electrode 15 being used as part of the mask. However, the ion injection may be conducted with the mask pattern 32 alone as the case of the first embodiment and then the control gate electrode 15 and the floating gate electrode 13 may be formed.

Meanwhile, it is necessary to place the floating gate electrode 13 above the embedded drain region 17a in the case of the split-gate type device described in the embodiment. Then it is preferable to inject ions in a self-consistent manner using the control gate electrode 15 as a mask because the mask registration for the control gate electrode 15 and the embedded drain region 17a can be eliminated.

Figure 22C:
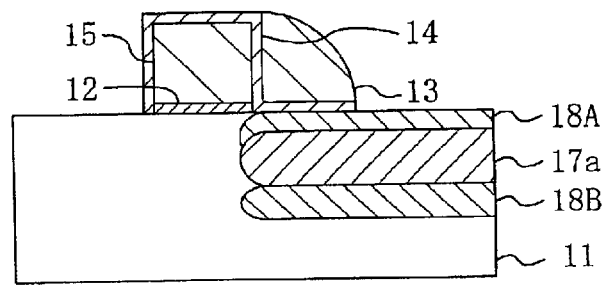

Next as shown in FIG. 22C, the mask pattern 32 is removed and then the gate dielectric film 12 is formed under the control gate electrode 15 by removing the gate dielectric formation film 12A with the control gate electrode 15 being used as a mask. Subsequently, a capacitance dielectric formation film of about 11 nm in thickness is formed by the thermal oxidation method or the like over the whole surface of the semiconductor substrate 11 including the surface of the control gate electrode 15. Next, a first gate electrode formation film made of about 0.2 μm-thick poly-silicon is deposited by the low pressure CVD method or the like on the capacitance dielectric formation film. Later, the floating gate electrode 13 is formed self-consistently from the first gate electrode formation film via the capacitance dielectric formation film on the side of the control gate electrode 15 by an anisotropic etching on the deposited first gate electrode formation film. Subsequently, the part of the first gate electrode formation film on the source region side and the part of the capacitance dielectric formation film exposed on the semiconductor substrate 11 are selectively etched and removed. In this way, the capacitance dielectric film 14 that will serve as a tunneling dielectric film is provided from the capacitance dielectric formation film in the region where the floating gate electrode 13 and the semiconductor substrate 11 are faced.

Figure 22D:
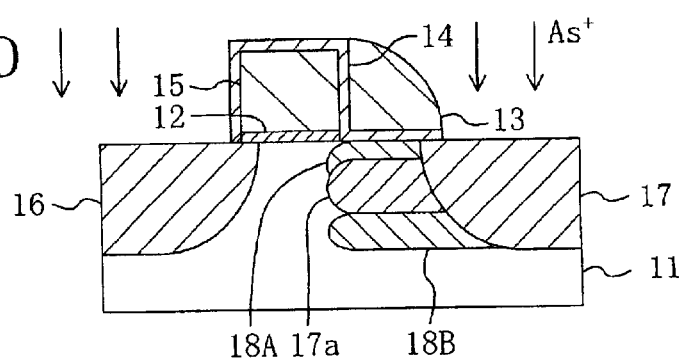

Subsequently, as shown in FIG. 22D, with the control gate electrode 15 and the floating gate electrode 13 at least being used as masks, the source region 16 is formed in the source formation region in the semiconductor substrate 11, by injecting arsenic (As) ions at an injection energy of about 50 keV and a dose of about $3.0 \times 10^{15}/cm^2$ in the semiconductor substrate 11; and then the drain region 17 is formed in the drain formation region so as to be connected to the embedded drain region 17a under the floating gate electrode 13.

In this way, according to the manufacturing method of the sixth embodiment of the invention, the embedded drain region 17a that has a predetermined impurity profile and is connected to the drain region 17 is formed under the split-gate type floating gate electrode 13 in the semiconductor substrate 11. In addition, the embedded region adjacent upper area 18A can be formed over the embedded drain region 17a, and the embedded region adjacent lower area 18B can be formed under the embedded drain region 17a.

In the present embodiment, the embedded region adjacent upper area 18A, embedded region adjacent lower area 18B and embedded drain region 17a may be formed in any desired order.

Both embedded region adjacent upper area 18A and embedded region adjacent lower area 18B are not necessarily formed, but only either of them may be formed.

Besides, the conduction type of the embedded drain region 17a may be a p-type of an impurity concentration lower than those in the embedded region adjacent upper area 18A and embedded region adjacent lower area 18B.

[Seventh Embodiment]

Now referring to attached drawings, a seventh embodiment of the present invention is described below.

Figure 23:
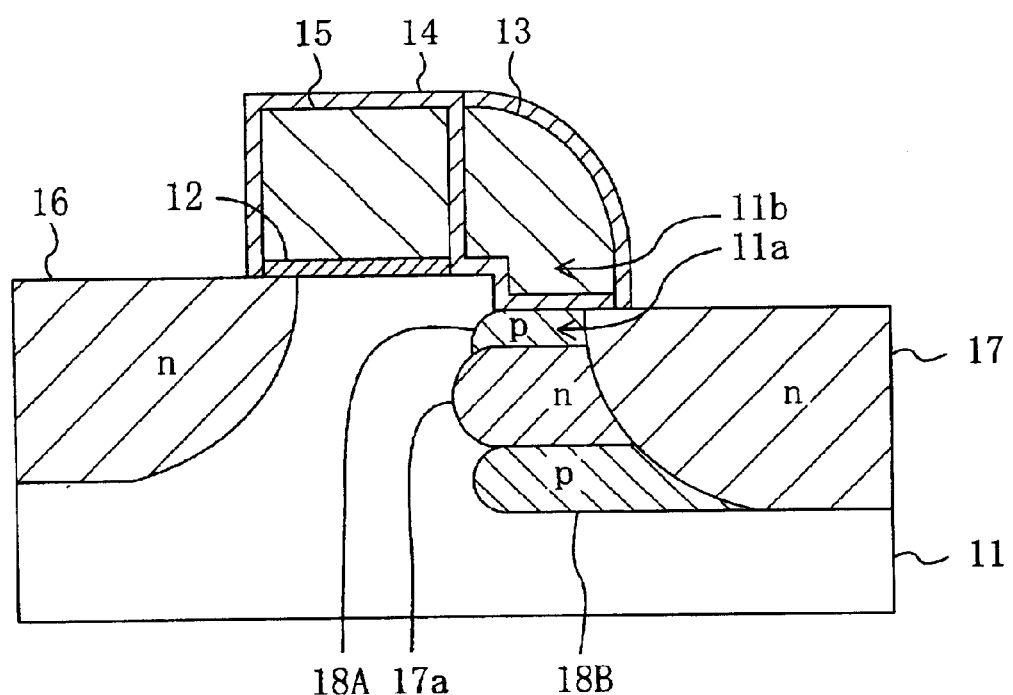
FIG. 23 is a sectional view of a nonvolatile semiconductor memory device according to a seventh embodiment of the present invention.

FIG. 23 is a sectional view of the nonvolatile semiconductor memory device according to the seventh embodiment of the present invention, specifically, the sectional structure of an n-type channel flash EEPROM. In FIG. 23, the same components as those in FIG. 21 are denoted with the same numerals and their explanation is omitted.

Referring now to FIG. 23, the nonvolatile semiconductor memory device according to the seventh embodiment has the split-gate type gate structure in which a control gate electrode 15 and the floating gate electrode 13 are arrayed on the semiconductor substrate 11. The stepped portion 11b is formed so that the drain region 17 under the floating gate electrode 13 in the semiconductor substrate 11 is at the lower stage of the stepped potion.

Then the same improvement obtained in the sixth embodiment is provided. Besides, the strong electric field in the lower stage channel region 11a in the direction parallel to the substrate and the concentrated electric field created near the corner of the stepped portion 11b are overlapped to augment the electric field along the substrate. As a result, a strong electric field appears in a wide range from the lower corner of the stepped portion 11b to lower stage channel region 11a, and thus hot electrons are created at a high efficiency.

[First Manufacturing Method of the Seventh Embodiment]

A first manufacturing method of the nonvolatile semiconductor memory device according to the seventh embodiment is explained below with reference to the attached drawings.

FIGS. 24A–26B are sectional views of the respective steps in the first manufacturing process for the nonvolatile semiconductor memory device according to the seventh embodiment of the present invention.

Figure 24A:
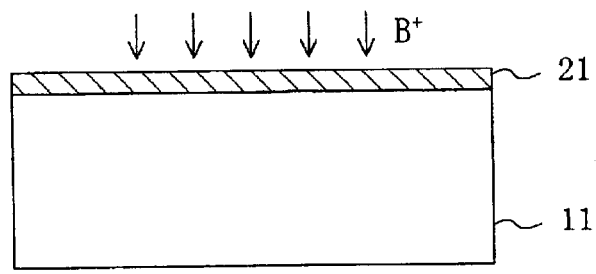
FIGS. 24A–24D are sectional views of the respective steps in a first manufacturing process for the nonvolatile semiconductor memory device according to the seventh embodiment of the present invention.

First, referring to FIG. 24A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage, at an injection energy of about 30 keV and a doze of $5.0 \times 10^{12}/cm^2$–$1.0 \times 10^{13}/cm^2$.

Figure 24B:
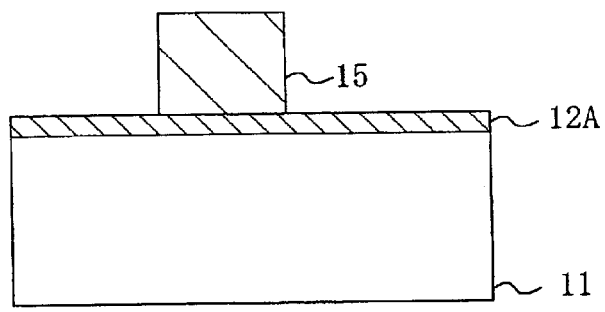

Next as shown in FIG. 24B, after the protective oxide film 21 has been removed, the gate dielectric formation film 12A of about 13 nm in thickness is formed by the thermal oxidation method or the like on the main surface of the semiconductor substrate 11. Subsequently, a poly-silicon film of about 0.2 μm in thickness is deposited on the gate dielectric formation film 12A by the low pressure CVD method, for example, and this deposited poly-silicon film is patterned by the photolithography and etching method to form the control gate electrode 15 serving as a second gate electrode.

Figure 24C:
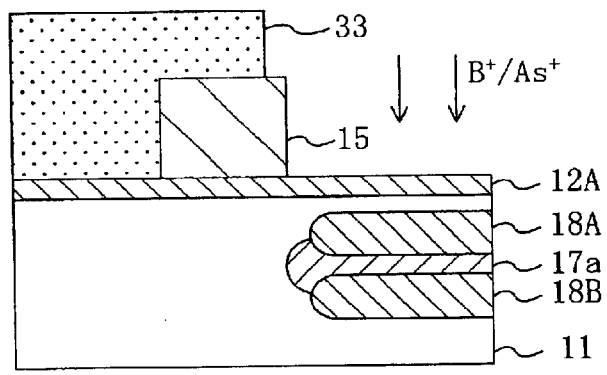

Next as shown in FIG. 24C, a first resist mask pattern 33 having an opening for exposing the drain formation region is formed on the semiconductor substrate 11. At this time, the first mask pattern 33 is formed so that its opening end facing the drain side is located on the control gate electrode 15 to make the drain side of the gate electrode 15 serve as a self-consistent mask. Subsequently, with the fabricated first mask pattern 33 and the control gate electrode 15 being used as masks, boron (B) ions serving as a p-type impurity are injected into the semiconductor substrate 11, at an injection energy of about 10 keV-30 keV and a dose of about $1.0 \times 10^{12}/cm^2$–$1.0 \times 10^{13}/cm^2$. In this way, the embedded region adjacent upper area 18A is formed in a shallow place in the semiconductor substrate 11. Further, boron (B) ions are injected at an injection energy higher than that adopted in forming the embedded region adjacent upper area 18A, namely, about 30 keV-50 keV and a dose of about $1.0 \times 10^{12}/\text{cm}^2-1.0 \times 10^{13}/\text{cm}^2$. In this way, the embedded region adjacent lower area 18B is formed so that its top is located in the bottom of or under the region to be formed as the embedded drain region.

Next, with the fabricated first mask pattern 33 and the control gate electrode 15 being used as masks, arsenic (As) ions serving as an n-type impurity are injected into the semiconductor substrate 11, at an injection energy of about 20 keV–50 keV and a dose of about $1.0 \times 10^{13}/\text{cm}^2-1.0 \times 10^{14}/\text{cm}^2$. In this way, the embedded drain region 17a is formed between the embedded region adjacent upper area 18A and the embedded region adjacent lower area 18B.

Figure 24D:
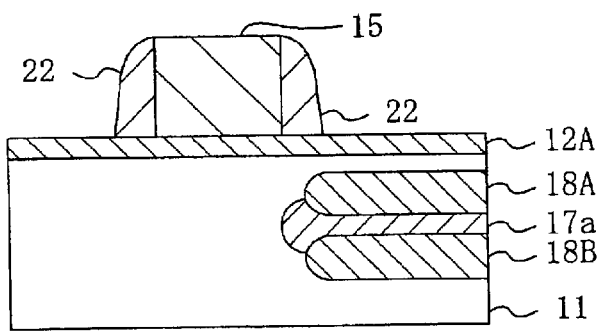

Next, referring now to FIG. 24D, after the first mask pattern 33 has been removed, a BPSG film is deposited by CVD, for example, on the whole surface of the semiconductor substrate 11. By anisotropic etching on the deposited BPSG film, sidewalls 22 are formed on the sides of the control gate electrode 15 so as to serve as etching masks for the fabrication of the stepped portion. The distance between the side of the control gate electrode 15 and the stepped portion can be adjusted by changing the film thickness of the sidewall 22. The film thickness of the BPSG film is set at about 0.1 $\mu$m in this case.

Figure 25A:
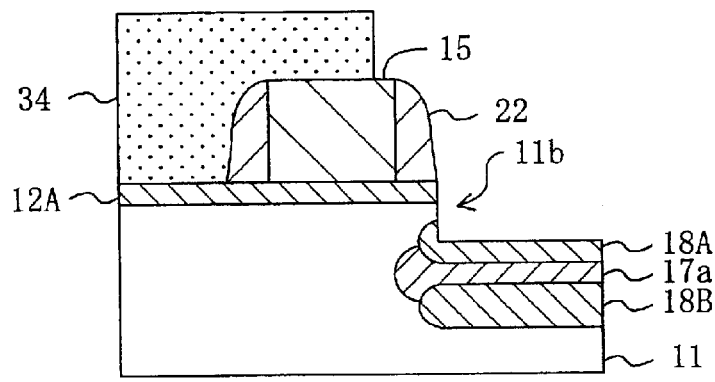
FIGS. 25A–25D are sectional views of the respective steps in the first manufacturing process for the nonvolatile semiconductor memory device according to the seventh embodiment of the present invention.

Subsequently, as shown in FIG. 25A, a second mask pattern 34 is formed that has an opening for exposing the drain formation region and the sidewall 22 on the drain formation side on the semiconductor substrate 11. Then with the formed second mask pattern 34 and the sidewall 22 being used as masks, the gate dielectric formation film 12A and the semiconductor substrate 11 are subject to an etching of, for example, 50 nm depth, so as to expose the embedded region adjacent upper area 18A. The stepped portion 11b is thereby formed in the upper part of the semiconductor substrate 11.

Figure 25B:
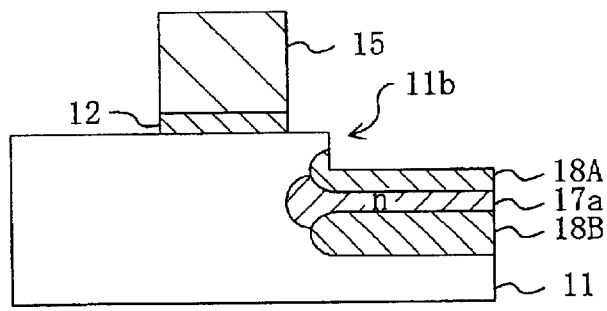

Next as shown in FIG. 25B, the second mask pattern 34 and the sidewalls 22 are removed and then the gate dielectric film 12 is formed under the control gate electrode 15 by removing the gate dielectric formation film 12A with the control gate electrode 15 being used as a mask.

Figure 25C:
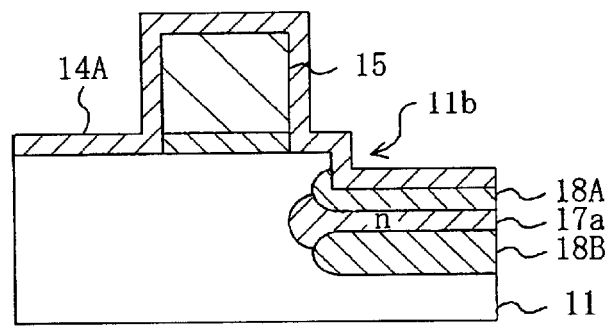

Subsequently, referring to FIG. 25C, a capacitance dielectric formation film 14A of about 11 nm in thickness is formed by the thermal oxidation method or the like over the whole surface of the semiconductor substrate 11 including the surface of the control gate electrode 15 and the stepped portion 11b.

Figure 25D:
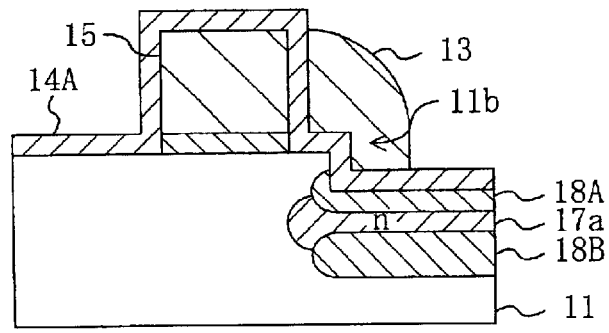

Next, referring to FIG. 25D, a first gate electrode formation film made of about 0.2 $\mu$m-thick poly-silicon is deposited by the low pressure CVD method or the like on the capacitance dielectric formation film 14A. Later, the floating gate electrode 13 is formed self-consistently from the first gate electrode formation film via the capacitance dielectric formation film 14A on the side of the control gate electrode 15 by an anisotropic etching on the deposited first gate electrode formation film.

Figure 26A:
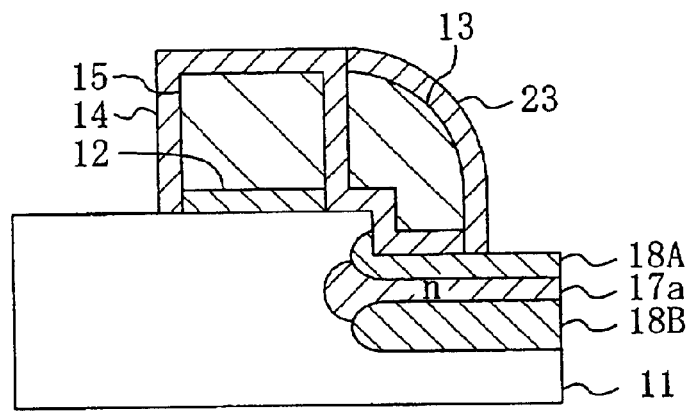
FIGS. 26A and 26B are sectional views of the respective steps in the first manufacturing process for the nonvolatile semiconductor memory device according to the seventh embodiment of the present invention.

Subsequently, as shown in FIG. 26A, the part of the capacitance dielectric formation film 14A exposed on the semiconductor substrate 11 is selectively etched and removed. In this way, the capacitance dielectric film 14 that will serve as a tunneling dielectric film is provided from the capacitance dielectric formation film 14A in the part where the floating gate electrode 13 and the semiconductor substrate 11 are faced. Later, a dielectric oxide film 23 is deposited on the exposed part of the floating gate electrode 13.

Figure 26B:
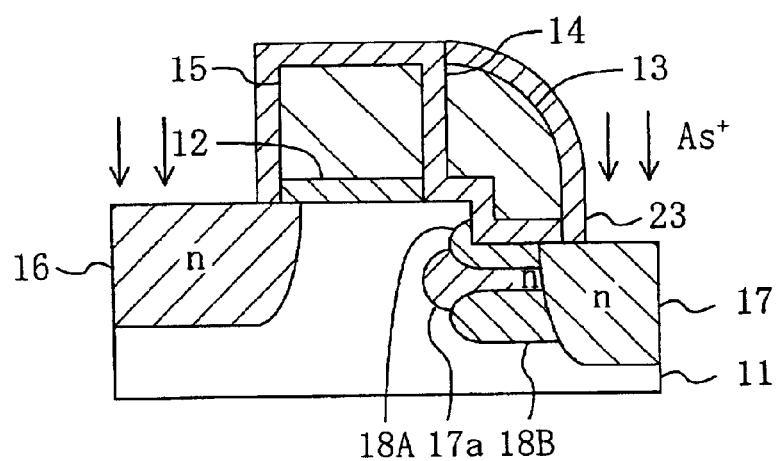

Subsequently, as shown in FIG. 26B, with the control gate electrode 15 and the floating gate electrode 13 at least being used as masks, the source region 16 is formed in the source foramtino region in the semiconductor substrate 11, by injecting arsenic (As) ions at an injection energy of about 50 keV and a dose of about $3.0 \times 10^{15}/\text{cm}^2$ in the semiconductor substrate 11; and then the drain region 17 is formed in the drain formation region so as to be connected to the embedded drain region 17a under the floating gate electrode 13.

In this way, according to the first manufacturing method of the seventh embodiment of the invention, the embedded drain region 17a that has a predetermined impurity profile and is connected to the drain region 17 is formed in the lower stage of the stepped portion 11b under the floating gate electrode 13 in the semiconductor substrate 11, inside the nonvolatile semiconductor memory device having the split-gate type floating gate electrode 13 that includes the stepped portion 11b. In addition, the embedded region adjacent upper area 18A can be formed over the embedded drain region 17a, and the embedded region adjacent lower area 18B can be formed under the embedded drain region 17a.

It should be noted that the embedded region adjacent upper area 18A, embedded region adjacent lower area 18B and embedded drain region 17a may be formed in any desired order.

Both embedded region adjacent upper area 18A and embedded region adjacent lower area 18B are not necessarily formed, but only either of them may be formed.

Besides, the conduction type of the embedded drain region 17a may be a p-type of an impurity concentration lower than those in the embedded region adjacent upper area 18A and embedded region adjacent lower area 18B.

[Second Manufacturing Method of the Seventh Embodiment]

A second manufacturing method of the nonvolatile semiconductor memory device according to the seventh embodiment is explained below with reference to the attached drawings.

FIGS. 27A–29B are sectional views of the respective steps in the second manufacturing process for the nonvolatile semiconductor memory device according to the seventh embodiment of the present invention.

Figure 27A:
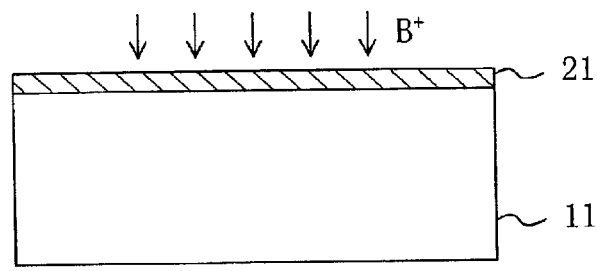
FIGS. 27A–27D are sectional views of the respective steps in a second manufacturing process for the nonvolatile semiconductor memory device according to the seventh embodiment of the present invention.

First, referring to FIG. 27A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage, at an injection energy of about 30 keV and a dose of $5.0 \times 10^{12}/\text{cm}^2-1.0 \times 10^{13}/\text{cm}^2$.

Figure 27B:
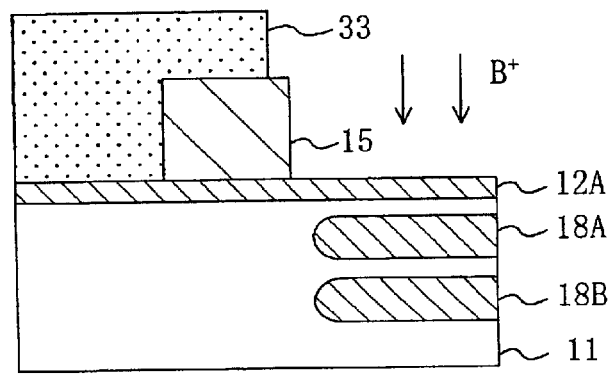

Next as shown in FIG. 27B, after the protective oxide film 21 has been removed, the gate dielectric formation film 12A of about 13 nm in thickness is formed by the thermal oxidation method or the like on the main surface of the semiconductor substrate 11. Subsequently, a poly-silicon film of about 0.2 $\mu$m in thickness is deposited on the gate dielectric formation film 12A by the low pressure CVD method, for example, and this deposited poly-silicon film is patterned by the photolithography and etching method to form the control gate electrode 15 serving as a second gate electrode.

Next, a first resist mask pattern 33 having an opening for exposing the drain foramtion region is formed on the semiconductor substrate 11. At this time, the first mask pattern 33 is formed so that its opening end facing the drain side is located on the control gate electrode 15 to make the drain side of the gate electrode 15 serve as a self-consistent mask. Subsequently, with the fabricated first mask pattern 33 and the control gate electrode 15 being used as masks, boron (B) ions serving as a p-type impurity are injected into the semiconductor substrate 11, at an injection energy of about 10 keV-30 keV and a dose of about $1.0\times10^{12}/cm^2$–$1.0\times10^{13}/cm^2$. In this way, the embedded region adjacent upper area 18A is formed in a shallow place in the semiconductor surface 11. Further, boron (B) ions are injected at an injection energy higher than that adopted in forming the embedded region adjacent upper area 18A, namely, about 30 keV-50 keV and a dose of about $1.0\times10^{12}/cm^2$–$1.0\times10^{13}/cm^2$. In this way, the embedded region adjacent lower area 18B is formed so that its top is located in the bottom of or under the region to be formed as the embedded drain region.

Figure 27C:
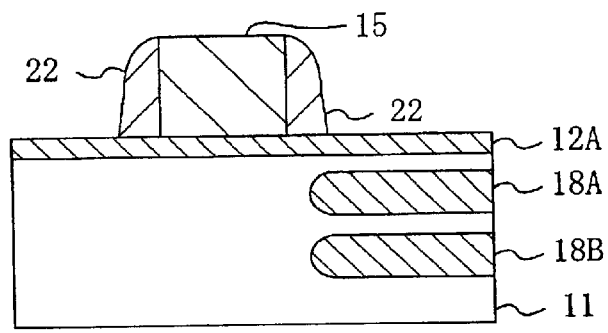

Next, referring now to FIG. 27C, after the first mask pattern 33 has been removed, a BPSG film of about 0.1 μm in thickness is deposited by CVD on the whole surface of the semiconductor substrate 11. By anisotropic etching on the deposited BPSG film, sidewalls 22 are formed on the sides of the control gate electrode 15 so as to serve as etching masks for the fabrication of the stepped portion.

Figure 27D:
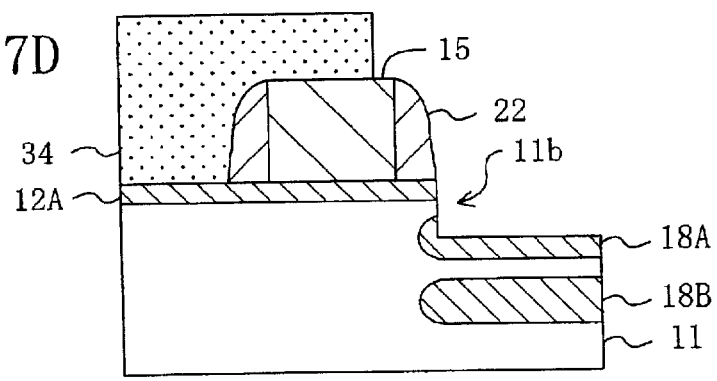

Subsequently, as shown in FIG. 27D, a second mask pattern 34 is formed that has an opening for exposing the drain formation region and the sidewall 22 on the potential drain side on the semiconductor substrate 11. Then with the formed second mask pattern 34 and the sidewall 22 being used as masks, the gate dielectric formation film 12A and the semiconductor substrate 11 are subject to an etching of, for example, 50 nm depth, so as to expose the embedded region adjacent upper area 18A and to form the stepped portion 11b in the upper part of the semiconductor substrate 11.

Figure 28A:
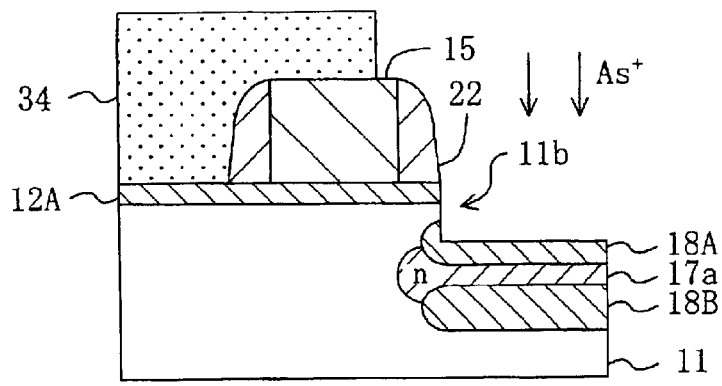
FIGS. 28A–28D are sectional views of the respective steps in the second manufacturing process for the nonvolatile semiconductor memory device according to the seventh embodiment of the present invention.

Next, as shown in FIG. 28A, with the second mask pattern 34 and the sidewall 22 being used as masks, arsenic (As) ions serving as an n-type impurity are injected into the lower stage of the stepped portion 11b in the semiconductor substrate 11, at an injection energy of about 20 keV–50 keV and a dose of about $1.0\times10^{13}/cm^2$–$1.0\times10^{14}/cm^2$. In this way, the embedded drain region 17a is formed between the embedded region adjacent upper area 18A and the embedded region adjacent lower area 18B.

Figure 28B:
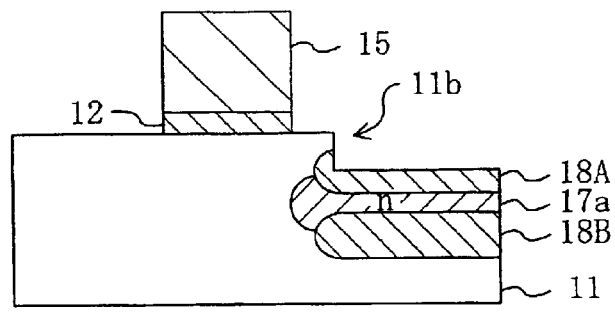

Next as shown in FIG. 28B, the second mask pattern 34 and the sidewalls 22 are removed and then the gate dielectric film 12 is formed under the control gate electrode 15 by removing the gate dielectric formation film 12A with the control gate electrode 15 being used as a mask.

Figure 28C:
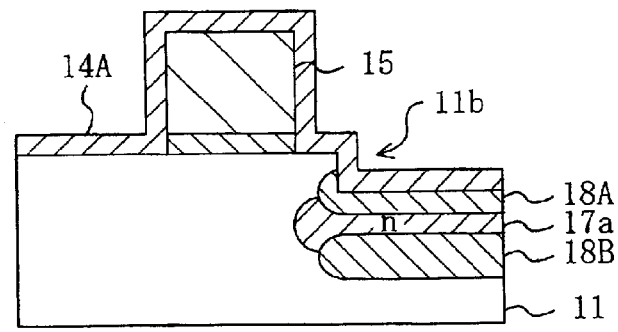

Subsequently, referring to FIG. 28C, a capacitance dielectric formation film 14A of about 11 nm in thickness is formed by the thermal oxidation method or the like over the whole surface of the semiconductor substrate 11 including the surface of the control gate electrode 15 and the stepped portion 11b.

Figure 28D:
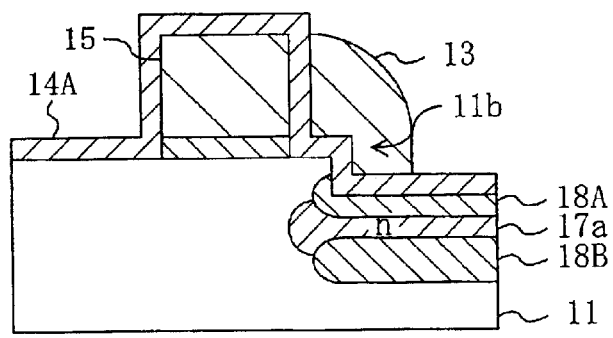

Next, referring to FIG. 28D, a first gate electrode formation film made of about 0.2 μm-thick poly-silicon is deposited by the low pressure CVD method or the like on the capacitance dielectric formation film 14A. Later, the floating gate electrode 13 is formed self-consistently from the first gate electrode formation film via the capacitance dielectric formation film 14A on the side of the control gate electrode 15 by an anisotropic etching on the deposited first gate electrode formation film.

Figure 29A:
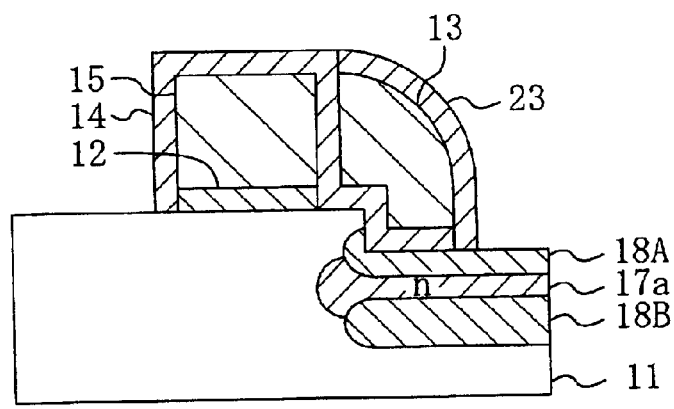
FIGS. 29A and 29B are sectional views of the respective steps in the second manufacturing process for the nonvolatile semiconductor memory device according to the seventh embodiment of the present invention.

Subsequently, as shown in FIG. 29A, the part of the capacitance dielectric formation film 14A exposed on the semiconductor substrate 11 is selectively etched and removed. In this way, the capacitance dielectric film 14 that will serve as a tunneling dielectric film is provided from the capacitance dielectric formation film 14A in the part where the floating gate electrode 13 and the semiconductor substrate 11 are faced. Later, the dielectric oxide film 23 is formed on the exposed portion of the floating gate electrode 13.

Figure 29B:
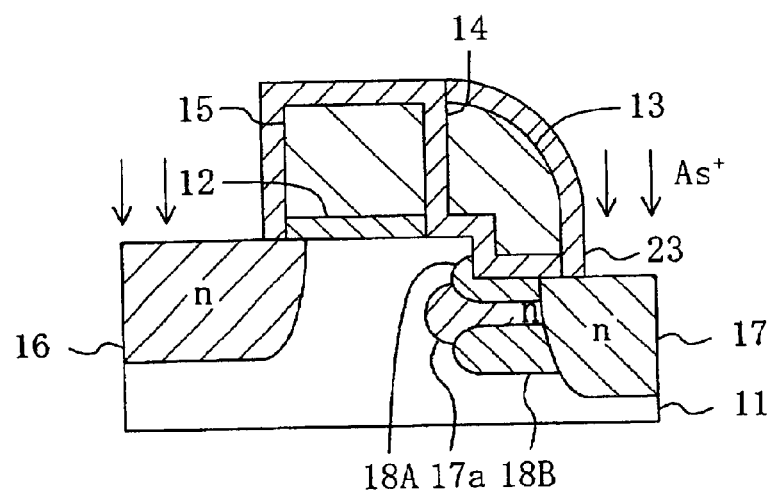

Then as shown in FIG. 29B, with the control gate electrode 15 and the floating gate electrode 13 at least being used as masks, the source region 16 is formed in the source formation region in the semiconductor substrate 11, by injecting arsenic (As) ions at an injection energy of about 50 keV and a dose of about $3.0\times10^{15}/cm^2$ in the semiconductor substrate 11; and then the drain region 17 is formed in the drain formation region so as to be connected to the embedded drain region 17a under the floating gate electrode 13.

In this way, according to the second manufacturing method of the seventh embodiment of the invention, the embedded drain region 17a that has a predetermined impurity profile and is connected to the drain region 17 is formed in the lower stage of the stepped portion 11b under the floating gate electrode 13 in the semiconductor substrate 11, inside the nonvolatile semiconductor memory device having the split-gate type floating gate electrode 13 that includes the stepped portion 11b. Further, the embedded region adjacent upper area 18A can be formed above the embedded drain region 17a, while the embedded region adjacent lower area 18B can be formed under the embedded drain region 17a.

The embedded region adjacent upper area 18A and embedded region adjacent lower area 18B were formed before the stepped portion 11b was formed, and the embedded drain region 17a was formed after the stepped portion 11b was formed in the second manufacturing method. However, it is not a fixed process sequence. Namely, the embedded drain region 17a may be formed before the stepped portion 11b is formed; and the embedded region adjacent upper area 18A and embedded region adjacent lower area 18B may be formed after the stepped portion 11b is formed.

Both embedded region adjacent upper area 18A and embedded region adjacent lower area 18B are not necessarily formed, but only either of them may be formed.

Besides, the conduction type of the embedded drain region 17a may be a p-type of an impurity concentration lower than those in the embedded region adjacent upper area 18A and embedded region adjacent lower area 18B.

[Third Manufacturing Method of the Seventh Embodiment]

A third manufacturing method of the nonvolatile semiconductor memory device according to the seventh embodiment is explained below with reference to the attached drawings.

FIGS. 30A–32B are sectional views of the respective steps in the third manufacturing process for the nonvolatile semiconductor memory device according to the seventh embodiment of the present invention.

Figure 30A:
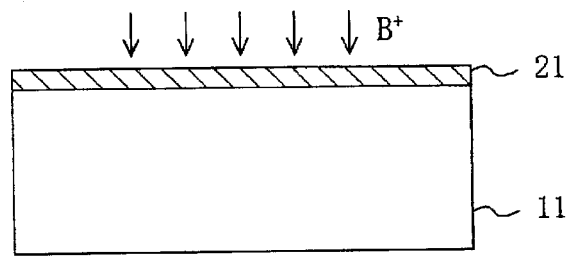
FIGS. 30A–30D are sectional views of the respective steps in a third manufacturing process for the nonvolatile semiconductor memory device according to the seventh embodiment of the present invention.

First, referring to FIG. 30A, a protective oxide film 21 made of silicon oxide is formed on the main surface of the semiconductor substrate 11, for example, made of silicon (Si), to protect the surface of the semiconductor substrate 11, by the thermal oxidation method, CVD method or other techniques. Subsequently, boron (B) ions are injected into the semiconductor substrate 11, which is the p-type impurity for controlling the threshold voltage, at an injection energy of about 30 keV and a doze of $5.0\times10^{12}/cm^2$–$1.0\times10^{13}/cm^2$.

Figure 30B:
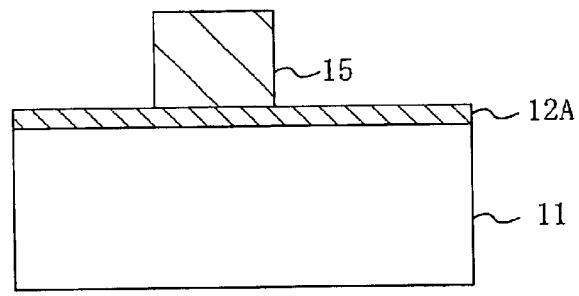

Next as shown in FIG. 30B, after the protective oxide film 21 has been removed, the gate dielectric formation film 12A of about 13 nm in thickness is formed by the thermal oxidation method or the like on the main surface of the semiconductor substrate 11. Subsequently, a poly-silicon film of about 0.2 μm in thickness is deposited on the gate dielectric formation film 12A by the low pressure CVD method, for example, and this deposited poly-silicon film is patterned by the photolithography and etching method to form the control gate electrode 15 serving as a second gate electrode.

Figure 30C:
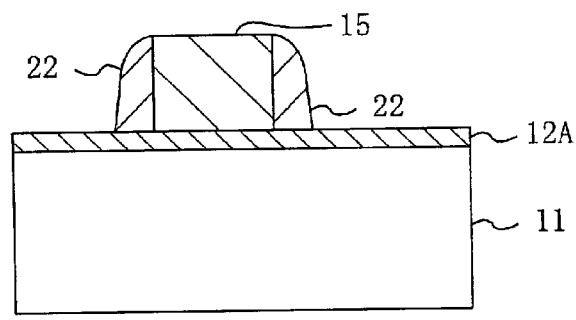

Next, referring now to FIG. 30C, a BPSG film of about 0.1 μm in thickness is deposited by CVD on the whole surface of the semiconductor substrate 11. By anisotropic etching on the deposited BPSG film, sidewalls 22 are formed on the sides of the control gate electrode 15 so as to serve as etching masks for the fabrication of the stepped portion.

Figure 30D:
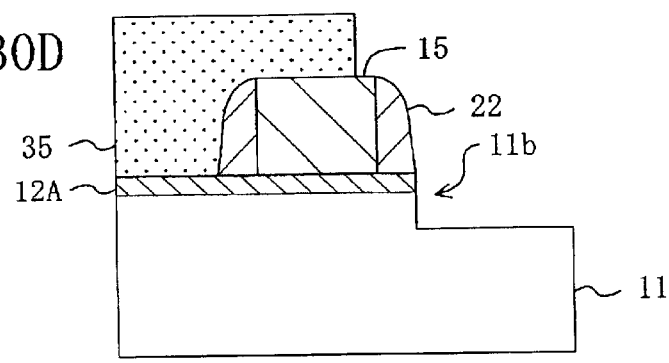

Subsequently, as shown in FIG. 30D, a mask pattern 35 is formed that has an opening for exposing the drain formation region and the sidewall 22 on the drain formation side on the semiconductor substrate 11. Then with the formed mask pattern 35 and the sidewall 22 being used as masks, the gate dielectric formation film 12A and the semiconductor substrate 11 are subject to an etching of, for example, 50 nm depth, in the upper part of the semiconductor substrate 11 to form a stepped portion 11b.

Figure 31A:
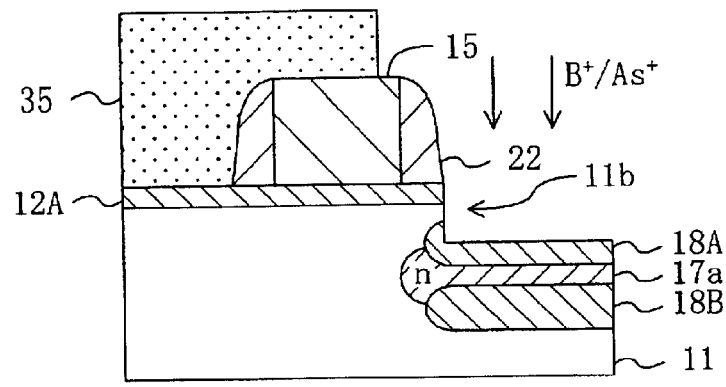
FIGS. 31A–31D are sectional views of the respective steps in the third manufacturing process for the nonvolatile semiconductor memory device according to the seventh embodiment of the present invention.

Next as shown in FIG. 31A, with the mask pattern 35 and the sidewall 22 being used as masks, boron (B) ions serving as a p-type impurity are injected into the semiconductor substrate 11, at an injection energy of about 10 keV-30 keV and a dose of about $1.0 \times 10^{12}/cm^2 - 1.0 \times 10^{13}/cm^2$. In this way, the embedded region adjacent upper area 18A is formed in a shallow place in the semiconductor substrate 11. Further, boron (B) ions are injected at an injection energy higher than that adopted in forming the embedded region adjacent upper area 18A, namely, about 30 keV-50 keV and a dose of about $1.0 \times 10^{12}/cm^2 - 1.0 \times 10^{13}/cm^2$. In this way, the embedded region adjacent lower area 18B is formed so that its top is located in the bottom of or under the region to be formed as the embedded drain region.

Then, with the mask pattern 35 and the sidewall 22 being used as masks, arsenic (As) ions serving as an n-type impurity are injected into the lower stage of the stepped portion 11b in the semiconductor substrate 11, at an injection energy of about 20 keV-50 keV and a dose of about $1.0 \times 10^{13}/cm^2 - 1.0 \times 10^{14}/cm^2$. In this way, the embedded drain region 17a is formed between the embedded region adjacent upper area 18A and the embedded region adjacent lower area 18B.

Figure 31B:
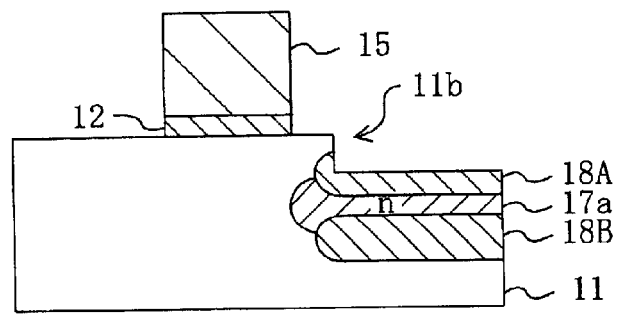

Next as shown in FIG. 31B, the mask pattern 35 and the sidewalls 22 are removed and then the gate dielectric film 12 is formed under the control gate electrode 15 by removing the gate dielectric formation film 12A with the control gate electrode 15 being used as a mask.

Figure 31C:
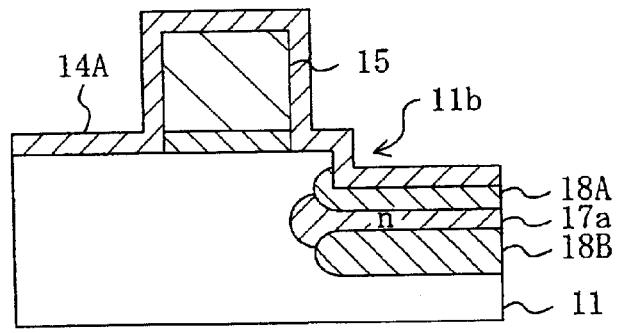

Subsequently, referring to FIG. 31C, a capacitance dielectric formation film 14A of about 11 nm in thickness is formed by the thermal oxidation method or the like over the whole surface of the semiconductor substrate 11 including the surface of the control gate electrode 15 and the stepped portion 11b.

Figure 31D:
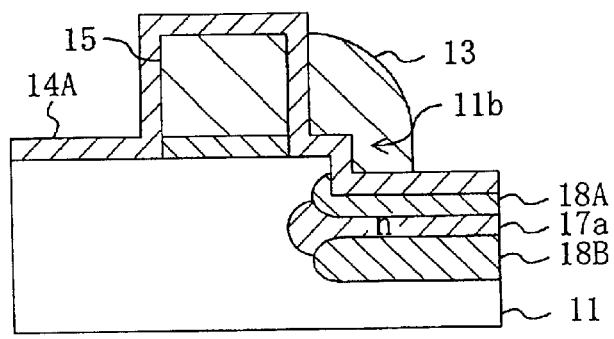

Next, referring to FIG. 31D, a first gate electrode formation film made of about 0.2 μm-thick poly-silicon is deposited by the low pressure CVD method or the like on the capacitance dielectric formation film 14A. Later, the floating gate electrode 13 is formed self-consistently from the first gate electrode formation film via the capacitance dielectric formation film 14A on the side of the control gate electrode 15 by an anisotropic etching on the deposited first gate electrode formation film.

Figure 32A:
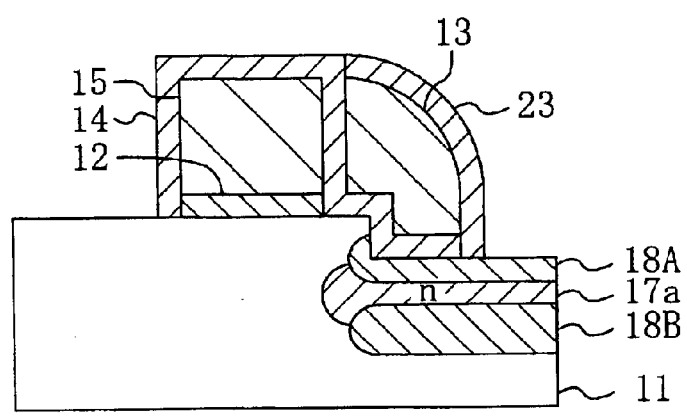
FIGS. 32A and 32B are sectional views of the respective steps in the third manufacturing process for the nonvolatile semiconductor memory device according to the seventh embodiment of the present invention.

Subsequently, as shown in FIG. 32A, the part of the capacitance dielectric formation film 14A exposed on the semiconductor substrate 11 is selectively etched and removed. In this way, the capacitance dielectric film 14 that will serve as a tunneling dielectric film is provided from the capacitance dielectric formation film 14A in the part where the floating gate electrode 13 and the semiconductor substrate 11 are faced. Later, the dielectric oxide film 23 is formed on the exposed portion of the floating gate electrode 13.

Figure 32B:
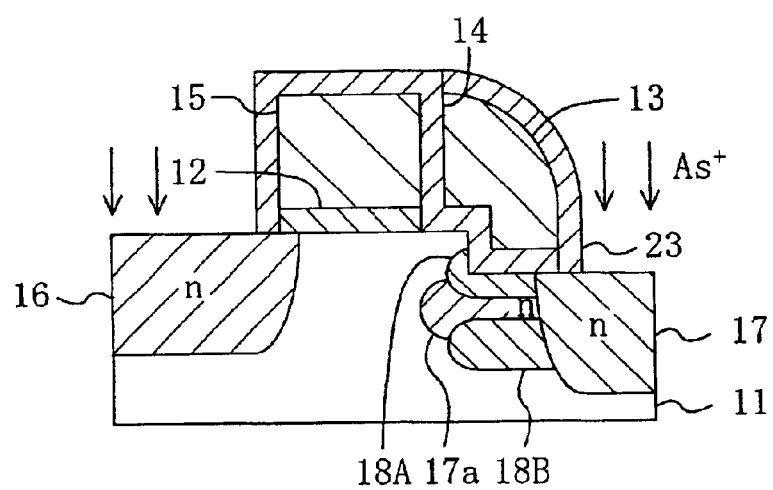
Figure 33:
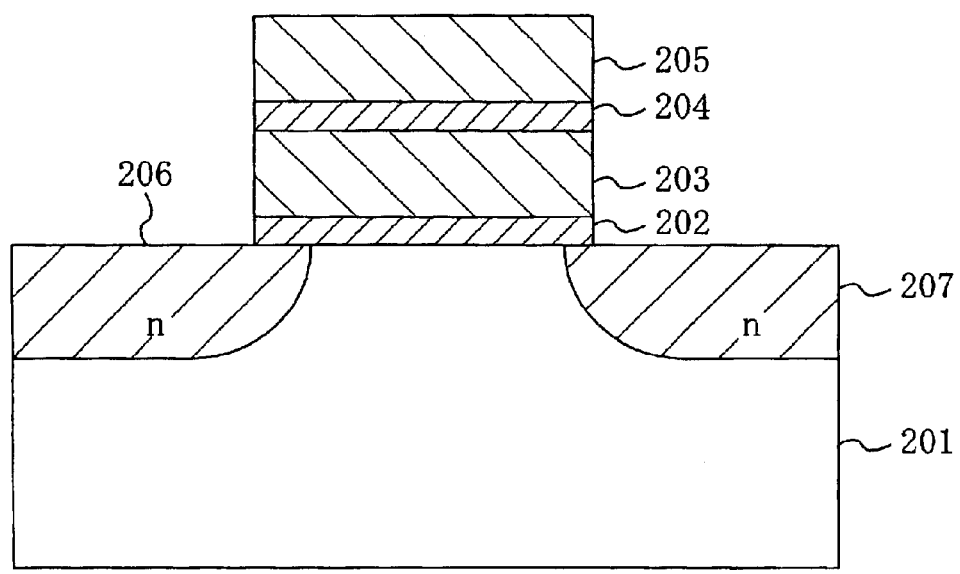
FIG. 33 is a sectional view of the prior art nonvolatile semiconductor memory device.

Then as shown in FIG. 32B, with the control gate electrode 15 and the floating gate electrode 13 at least being used as masks, the source region 16 is formed in the source foramtion region in the semiconductor substrate 11, by injecting arsenic (As) ions at an injection energy of about 50 keV and a dose of about $3.0 \times 10^{15}/cm^2$ in the semiconductor substrate 11; and then the drain region 17 is formed in the drain formation region so as to be connected to the embedded drain region 17a under the floating gate electrode 13.

In this way, according to the third manufacturing method of the seventh embodiment of the invention, the embedded drain region 17a that has a predetermined impurity profile and is connected to the drain region 17 is formed in the lower stage of the stepped portion 11b under the floating gate electrode 13 in the semiconductor substrate 11, inside the nonvolatile semiconductor memory device having the split-gate type floating gate electrode 13 that includes the stepped portion 11b. Further, the embedded region adjacent upper area 18A can be formed above the embedded drain region 17a, while the embedded region adjacent lower area 18B can be formed under the embedded drain region 17a.

It should be noted that the embedded region adjacent upper area 18A, embedded region adjacent lower area 18B and embedded drain region 17a may be formed in any desired order.

Both embedded region adjacent upper area 18A and embedded region adjacent lower area 18B are not necessarily formed, but only either of them may be formed.

Besides, the conduction type of the embedded drain region 17a may be a p-type of an impurity concentration lower than those in the embedded region adjacent upper area 18A and embedded region adjacent lower area 18B.

In the seventh embodiment as well, the ion injection to the embedded region adjacent upper area 18A, embedded region adjacent lower area 18B and embedded drain region 17a were self-consistently performed, with the control gate electrode 15 being used as part of the mask. However, the ion injection may be performed only with the mask pattern and then the control gate electrode 15 and the floating gate electrode 13 may be formed. It should be noted that the floating gate electrode 13 is required to be made above the embedded drain region 17a in the case of the split-gate type device described in the present embodiment. Thus it is preferable to conduct self-consistent ion injection using the control gate electrode 15 as a mask.

What is claimed is:

1. A nonvolatile semiconductor memory device comprising:

a floating gate electrode formed on a semiconductor region via a first dielectric film;

a control gate electrode capacitively coupled with said floating gate electrode via a second dielectric film; and a source region and a drain region that are formed in said semiconductor region on side regions of said floating gate electrode and control gate electrode;

wherein the end of said drain region faced with said source region has an embedded drain region extending toward said source region without reaching the surface of said semiconductor region, and a channel region is formed near the surface of said semiconductor region directly above said embedded drain region such that the channel region reaches the surface of said semiconductor region.

2. The nonvolatile semiconductor memory device according to claim 1, wherein said drain region creates an electric field so that the carriers injected to said floating gate electrode are subject to an external force having an element directed from said semiconductor region to said floating gate electrode.

3. The nonvolatile semiconductor memory device according to claim 1,
wherein said semiconductor region has a stepped portion, said floating gate electrode is formed astride said stepped portion, and
said drain region and embedded drain region are formed under a lower side of the said stepped portion.

4. The nonvolatile semiconductor memory device according to claim 1, wherein the carriers located in said channel region under said floating gate are subject to a force element of the electric field perpendicular to the surface of said semiconductor region when a predetermined voltage is applied to said control gate electrode or said drain region.

5. The nonvolatile semiconductor memory device according to claim 1, wherein said control gate electrode is formed above said floating gate electrode.

6. The nonvolatile semiconductor memory device according to claim 1, wherein said control gate electrode is formed on said semiconductor region in the vicinity of the side of said floating gate electrode.

7. The nonvolatile semiconductor memory device according to claim 1, wherein said embedded drain region has the same conduction type as that of said drain region.

8. The nonvolatile semiconductor memory device according to claim 7, wherein said embedded drain region has an impurity concentration lower than that in said drain region.

9. The nonvolatile semiconductor memory device according to claim 1, further comprising an embedded region adjacent a lower area that is formed in the lower part of said embedded drain region in said semiconductor region and has a conduction type opposite to that of said drain region.

10. The nonvolatile semiconductor memory device according to claim 9, wherein an impurity concentration in said embedded region is higher than that in said semiconductor region.

11. The nonvolatile semiconductor memory device according to claim 1, further comprising an embedded region adjacent an upper area that is formed in an upper part of said embedded drain region in the semiconductor region and has a conduction type opposite to that of said drain region.

12. The nonvolatile semiconductor memory device according to claim 11, wherein an impurity concentration in said embedded region is higher than that in said semiconductor region.

13. The nonvolatile semiconductor memory device according to claim 11, wherein said embedded drain region has a conduction type opposite to that of said drain region and an impurity concentration lower than that in said embedded region.

14. A nonvolatile semiconductor memory device comprising:
a floating gate electrode formed on a semiconductor region via a first dielectric film;
a control gate electrode capacitively coupled with said floating gate electrode via a second dielectric film; and
a source region and a drain region that are formed in said semiconductor region on side regions of said floating gate electrode and control gate electrode;
wherein the end of said drain region faced with said source region has an embedded drain region extending toward said source region without reaching the surface of said semiconductor region, and
a channel region is formed near the surface of said semiconductor region above said embedded drain region,
said nonvolatile semiconductor memory device further comprising an embedded region adjacent an upper area that is formed in an upper part of said embedded drain region in the semiconductor region and has a conduction type opposite to that of said drain region, wherein said embedded drain region has a conduction type opposite to that of said drain region and an impurity concentration lower than that in said embedded region.

15. A nonvolatile semiconductor memory device comprising:
a floating gate electrode formed on a semiconductor region via a first dielectric film;
a control gate electrode capacitively coupled with said floating gate electrode via a second dielectric film; and
a source region and a drain region that are formed in said semiconductor region on side regions of said floating gate electrode and control gate electrode;
wherein the end of said drain region faced with said source region has an embedded drain region extending toward said source region without reaching the surface of said semiconductor region, and
a channel region is formed near the surface of said semiconductor region above said embedded drain region,
said nonvolatile semiconductor memory device further comprising an embedded region adjacent a lower area that is formed in the lower part of said embedded drain region in said semiconductor region and has a conduction type opposite to that of said drain region.

16. The nonvolatile semiconductor memory device according to claim 15, wherein an impurity concentration in said embedded region is higher than that in said semiconductor region.

17. A nonvolatile semiconductor memory device comprising:
a floating gate electrode formed on a semiconductor region via a first dielectric film;
a control gate electrode capacitively coupled with said floating gate electrode via a second dielectric film; and
a source region and a drain region that are formed in said semiconductor region on side regions of said floating gate electrode and control gate electrode;
wherein the end of said drain region faced with said source region has an embedded drain region extending toward said source region without reaching the surface of said semiconductor region, and
a channel region is formed near the surface of said semiconductor region above said embedded drain region,
wherein said semiconductor region has a stepped portion, said floating gate electrode is formed astride said stepped portion, and
said drain region and embedded drain region are formed under a lower side of the said stepped portion.

18. A nonvolatile semiconductor memory device comprising:

a floating gate electrode formed on a semiconductor region via a first dielectric film;

a control gate electrode capacitively coupled with said floating gate electrode via a second dielectric film; and a source region and a drain region that are formed in said semiconductor region on side regions of said floating gate electrode and control gate electrode;

wherein the end of said drain region faced with said source region has an embedded drain region extending toward said source region without reaching the surface of said semiconductor region, and a channel region is formed near the surface of said semiconductor region above said embedded drain region, wherein said control gate electrode is formed on said semiconductor region in the vicinity of the side of said floating gate electrode.

* * * * *